United States Patent
Costa et al.

(10) Patent No.: US 8,824,211 B1
(45) Date of Patent: Sep. 2, 2014

(54) GROUP WORD LINE ERASE AND ERASE-VERIFY METHODS FOR 3D NON-VOLATILE MEMORY

(71) Applicant: SanDisk Technologies Inc., Plano, TX (US)

(72) Inventors: Xiying Costa, San Jose, CA (US); Alex Mak, Los Altos Hills, CA (US); Johann Alsmeier, San Jose, CA (US); Man L. Mui, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/767,708

(22) Filed: Feb. 14, 2013

(51) Int. Cl.
*G11C 11/34* (2006.01)
*G11C 16/14* (2006.01)

(52) U.S. Cl.
CPC ..................................... *G11C 16/14* (2013.01)
USPC ................................ 365/185.22; 365/185.24

(58) Field of Classification Search
USPC ........................................ 365/185.22, 185.24
See application file for complete search history.

(56) References Cited

U.S. PATENT DOCUMENTS

| | | | |
|---|---|---|---|
| 7,430,138 B2 | 9/2008 | Higashitani | |
| 7,586,157 B2 * | 9/2009 | Mokhlesi et al. | 257/365 |
| 7,606,074 B2 | 10/2009 | Wan et al. | |
| 7,606,100 B2 | 10/2009 | Hemink et al. | |
| 8,467,246 B2 * | 6/2013 | Kim et al. | 365/185.17 |
| 2006/0279999 A1 | 12/2006 | Byeon et al. | |
| 2011/0199833 A1 | 8/2011 | Shim et al. | |
| 2013/0016561 A1 | 1/2013 | Nam | |
| 2013/0028027 A1 | 1/2013 | Kim et al. | |

OTHER PUBLICATIONS

U.S. Appl. No. 13/450,294, filed Apr. 18, 2012.
U.S. Appl. No. 61/682,600, filed Aug. 13, 2012.
Invitation to Pay Additional Fees and Partial Search Report dated May 14, 2014, International Application No. PCT/US2014/015451.
Non-final Office Action dated Jun. 20, 2014, U.S. Appl. No. 14/273,900, filed May 9, 2014.
Response to Office Action dated Jul. 2, 2014, U.S. Appl. No. 14/273,900, filed May 9, 2014.

* cited by examiner

*Primary Examiner* — Michael Tran
(74) *Attorney, Agent, or Firm* — Vierra Magen Marcus LLP

(57) ABSTRACT

An erase operation for a 3D stacked memory device assigned storage elements to groups according to an expected erase speed. The storage elements are then erased according to their group to provide a more uniform erase depth and a tighter erase distribution. In one approach, the control gate voltages are set differently for the different groups to slow down the storage elements which are expected to have a faster programming speed. An erase or inhibit status can be set for all groups together. In another approach, the control gate voltages are common for the different groups but an erase or inhibit status is set for each group separately.

20 Claims, 18 Drawing Sheets

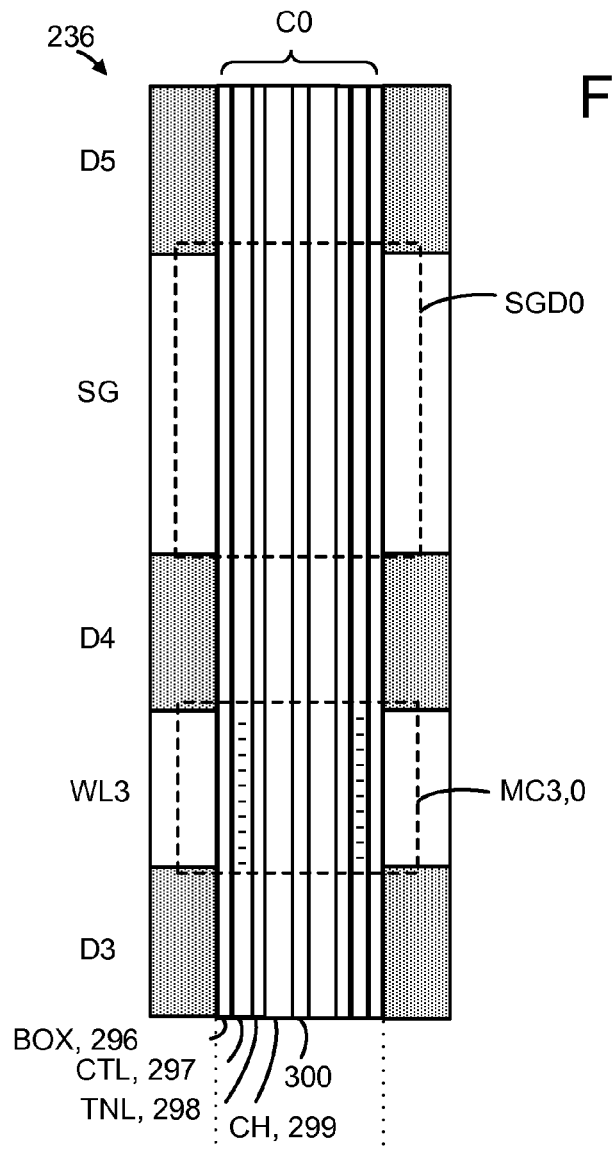
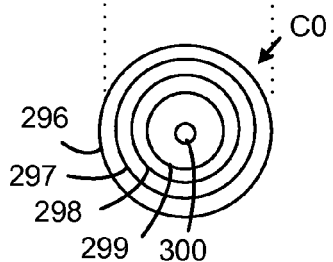

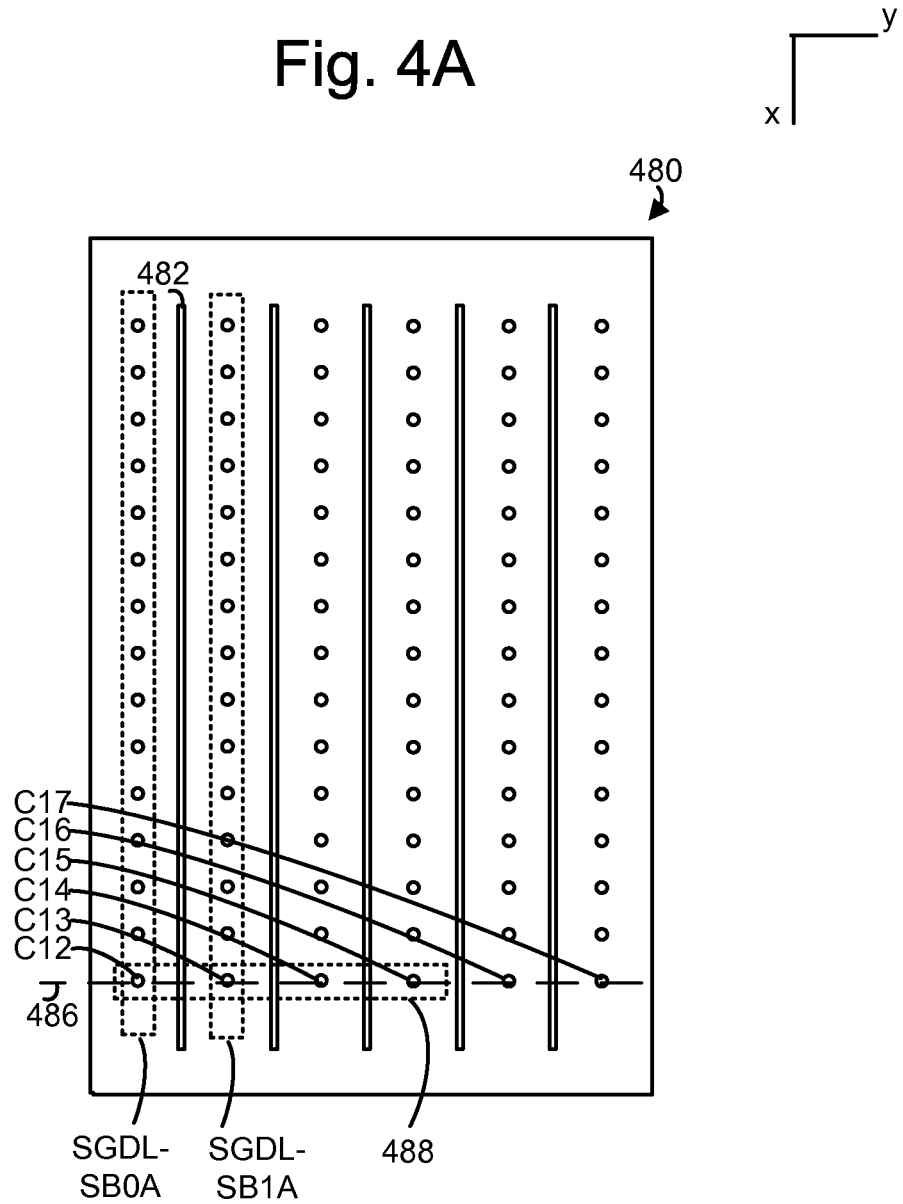

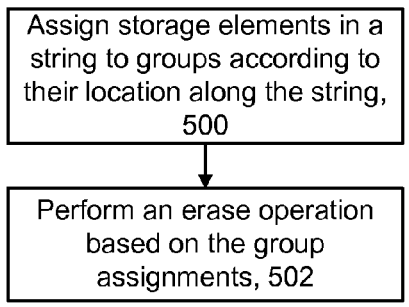
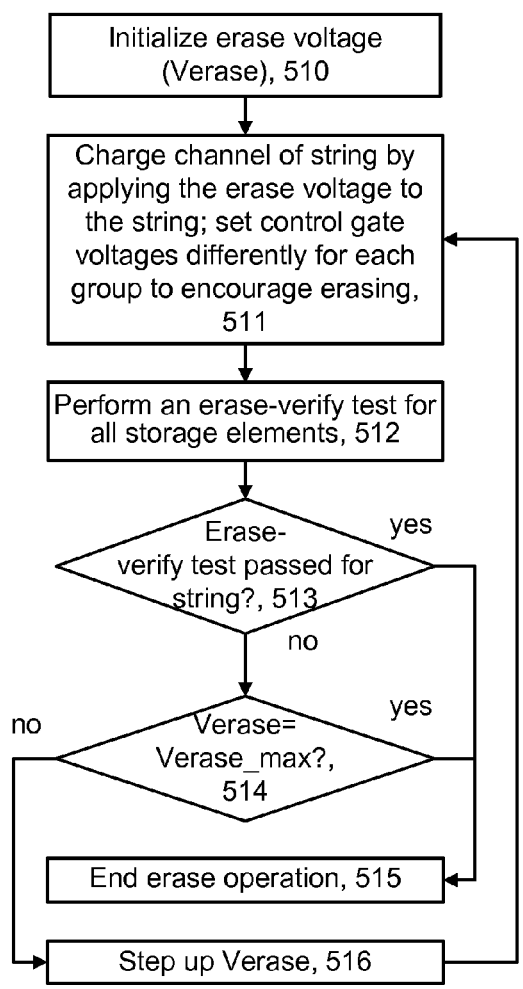
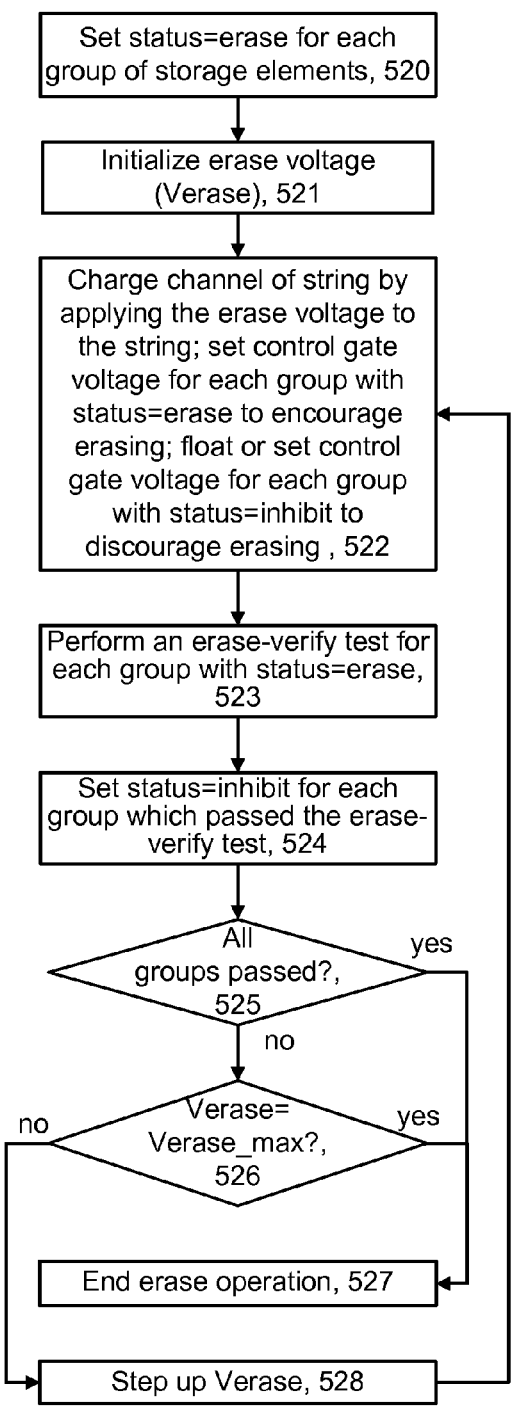

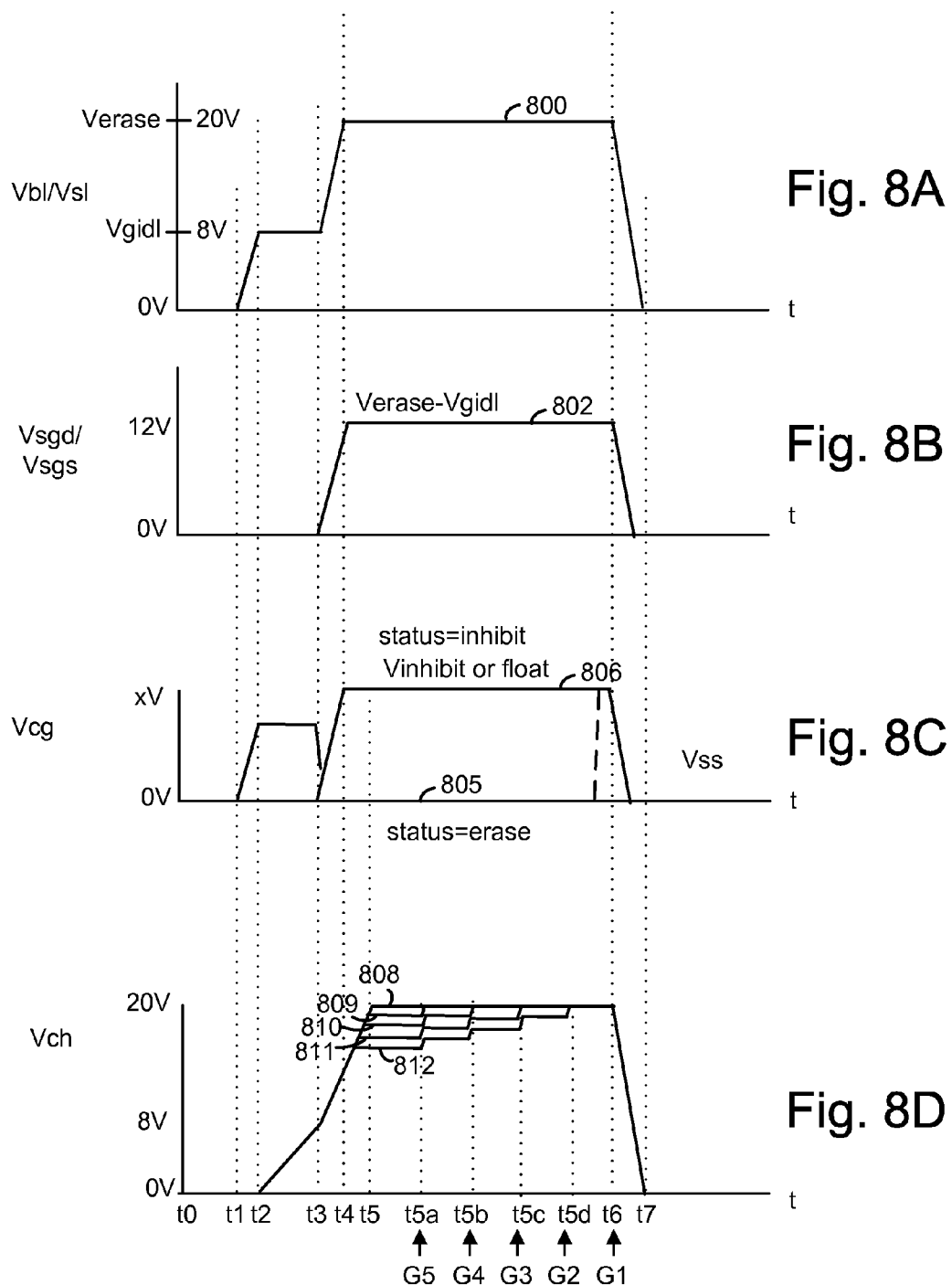

GROUP WORD LINE ERASE AND ERASE-VERIFY METHODS FOR 3D NON-VOLATILE MEMORY

BACKGROUND OF THE INVENTION

1. Field of the Invention

The present invention relates to techniques for erasing memory cells in a 3D-non-volatile memory device.

2. Description of the Related Art

Recently, ultra high density storage devices have been proposed using a 3D stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

BRIEF DESCRIPTION OF THE DRAWINGS

Like-numbered elements refer to common components in the different figures.

FIG. 3A depicts a close-up view of the region 236 of the column C0 of FIG. 2C, showing a drain-side select gate SGD0 and a memory cell MC303.

FIG. 3B depicts a cross-sectional view of the column C0 of FIG. 3A.

FIG. 4A depicts a top view of a straight NAND string embodiment 480 of the block BLK0 of FIG. 1A, showing example SGD line subsets SGDL-SB0A and SGDL-SB1A and example bit line subsets.

FIG. 5A depicts a flowchart of an example erase operation.

FIG. 5B depicts a flowchart of an example erase operation according to step 502 of FIG. 5A in which control gate voltages are set differently for different groups of storage elements.

FIG. 5C depicts a flowchart of another example erase operation according to step 502 of FIG. 5A in which groups of storage elements can be individually inhibited from further erase.

FIG. 7A depicts example voltages for a bit line and source line in a two-sided erase.

FIG. 7B depicts example voltages for SGD and SGS transistors.

FIG. 7C depicts example control gate voltages for different groups of storage elements.

FIG. 7D depicts example channel voltages for the different groups of storage elements.

FIG. 7E depicts a difference between the channel voltages of FIG. 7D and the control gate voltages of FIG. 7C.

FIGS. 8A-8D depict example voltages during the erase portion of an erase-verify iteration of an erase operation according to FIG. 5C.

FIG. 8A depicts example voltages for a bit line and source line in a two-sided erase.

FIG. 8B depicts example voltages for SGD and SGS transistors.

FIG. 8C depicts example control gate voltages for uninhibited and inhibited groups of storage elements.

FIG. 8D depicts example channel voltages for the different groups of storage elements.

FIG. 9A depicts a bit line voltage 900.

FIG. 9B depicts a SGS transistor and SGD transistor voltage 902.

FIG. 9C depicts an unselected word line voltage 904 and a selected word line voltage 906.

DETAILED DESCRIPTION

Figure 1A:
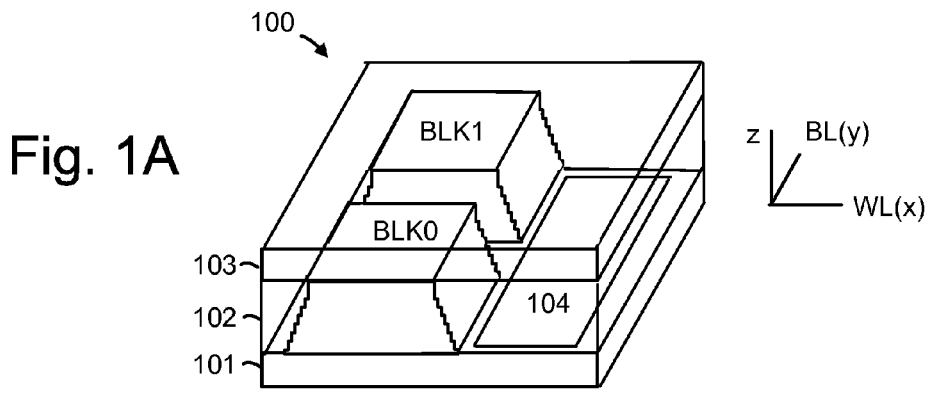
FIG. 1A is a perspective view of a 3D stacked non-volatile memory device.

Techniques are provided for uniformly erasing storage elements in a 3D stacked non-volatile memory device.

In 2D NAND memory devices, the p-well substrate is biased at a high voltage to erase the storage elements (memory cells). In contrast, a 3D stacked non-volatile memory device such as BiCS does not have substrate. One approach to erasing is to generate gate induced drain leakage (GIDL) current to charge up the channel, raise the channel potential to an erase voltage, and maintain this channel potential during erase. Therefore, the erase speed is affected by channel charging up time and erase performance is impacted by interactions between channel potential, tunneling speed, and GIDL current. Further, the tunneling speed is also affected by variations in the diameter of the memory hole. The erase process thus has a layer dependent pattern which can impact data retention.

Erase techniques provided herein address the above challenges. The techniques provide a uniform erase depth among different layers by assigning the storage elements to groups and adjusting the erase process according to the group. Group word line erase and erase-verify methods are provided which improve overall performance.

The erase speed and depth can vary along a string due to factors such as variations in a potential drop in the channel relative to a driven end of a string of storage elements and variations in the diameter of the memory hole. A potential drop occurs when holes are diverted from the channel and tunnel through a tunneling layer to a charge trapping layer of the storage elements. The holes recombine with electrons there to reduce the charge in the charge trapping layer, thereby erasing the storage elements.

Storage elements which are further from the driven end, e.g., the drain side or source side of a NAND string, will experience a larger potential drop which slows their erase speed. Regarding the memory hole, its diameter can vary due to process variations. In some cases, the memory hole is vertical and tapered, becoming smaller at the bottom. A smaller diameter results in a stronger field and a faster erase speed.

To compensate for these factors, in one approach, the control gate voltages can be set higher for the storage elements which are expected to have a faster programming speed to slow down their erase speed and equalize the erase speed along the string. In one approach, the control gate voltages can be set higher for the storage elements which are closer to the driven end. In practice, testing can indicate erase speed variations along a string and the control gate voltage can be set accordingly. Further, groups of adjacent storage elements can be provided with a same control gate voltage to avoid having to generate a different control gate voltage for every storage element, although this is also possible. Groups of multiple adjacent storage elements are expected to have a similar erase speed.

In another approach, storage elements which complete an erase-verify test are inhibited from further erase so that they do not continue to divert holes from the channel. As a result, these holes can be used by other storage elements which have not yet passed the erase-verify test. Further, the inhibited storage elements themselves can generate additional GIDL current to assist in erasing the other storage elements. To reduce the amount of verify overhead data, the erase-verify test can be carried out on a per group basis, so that a group of storage elements passes the erase-verify test when all of the storage elements in the group pass the erase-verify test. Optionally, the erase-verify test can be carried out on a per storage element basis. Combinations of the above approaches can be used as well.

Advantages include a tightened erase distribution, enhanced erase speed, improved channel potential boosting and improved reliability.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
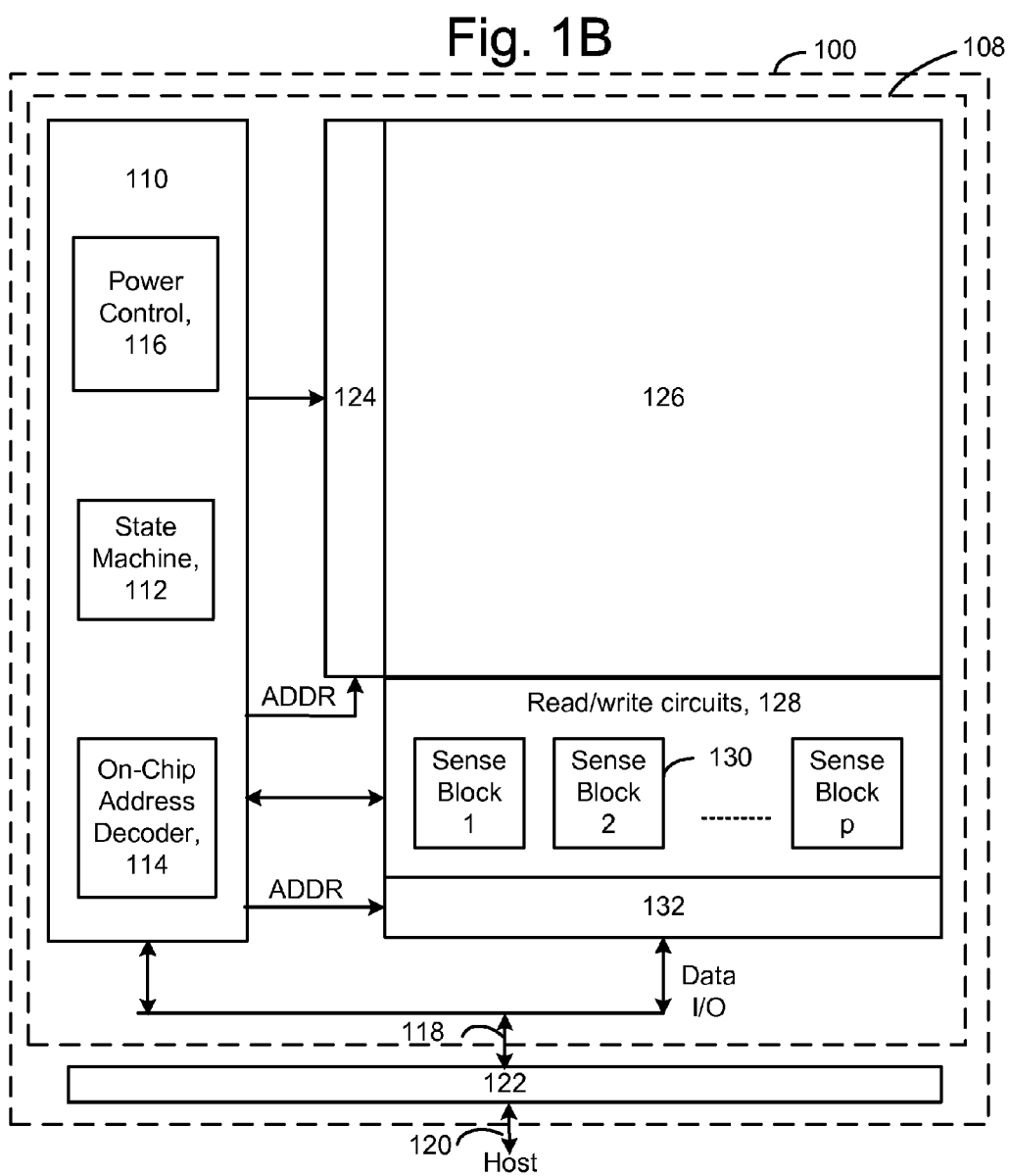
FIG. 1B is a functional block diagram of the 3D stacked non-volatile memory device 100 of FIG. 1A.

FIG. 1B is a functional block diagram of the 3D stacked non-volatile memory device 100 of FIG. 1A. The memory device 100 may include one or more memory die 108. The memory die 108 includes a 3D (three-dimensional) memory array 126 of storage elements, e.g., including the blocks BLK0 and BLK1, control circuitry 110, and read/write circuits 128. The memory array 126 is addressable by word lines via a row decoder 124 and by bit lines via a column decoder 132. The read/write circuits 128 include multiple sense blocks 130 (sensing circuitry) and allow a page of storage elements to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The control circuitry 110 cooperates with the read/write circuits 128 to perform memory operations on the memory array 126, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers and word line layer portions, drain- and source-side select gate drivers (referring, e.g., to drain- and source-sides or ends of a string of memory cells such as a NAND string, for instance) and source lines. The sense blocks 130 can include bit line drivers, in one approach.

In some implementations, some of the components can be combined. In various designs, one or more of the components (alone or in combination), other than memory array 126, can be thought of as at least one control circuit. For example, a control circuit may include any one of, or a combination of, control circuitry 110, state machine 112, decoders 114/132, power control module 116, sense blocks 130, read/write circuits 128, and controller 122, and so forth.

In another embodiment, a non-volatile memory system uses dual row/column decoders and read/write circuits. Access to the memory array 126 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the memory array 126. In this way, the density of the read/write modules is reduced by one half.

Other types of non-volatile memory in addition to NAND flash memory can also be used.

Figure 2A:
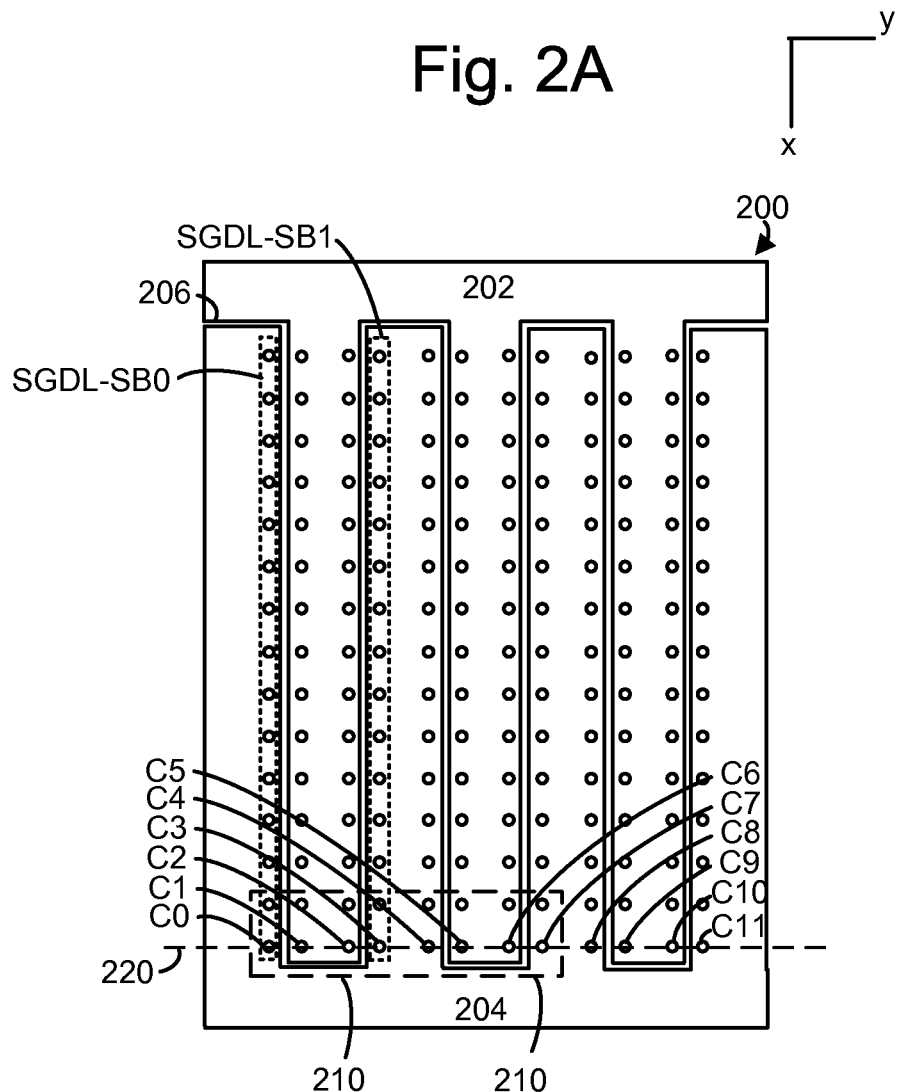
FIG. 2A depicts a top view of a U-shaped NAND embodiment of a block 200, showing example SGD line subsets SGDL-SB0 and SGDL-SB1, as an example implementation of BLK0 in FIG. 1A.

FIG. 2A depicts a top view of a U-shaped NAND embodiment of a block 200, showing example SGD line subsets SGDL-SB0 and SGDL-SB1, as an example implementation of BLK0 in FIG. 1A. The view is of a representative layer among the multiple word line layers in a stack. Referring also to FIG. 2C, the stack includes alternating dielectric and conductive layers. The dielectric layers include D0 to D5 and may be made of SiO2, for instance. The conductive layers include BG, which is a back gate layer, WL0 to WL3, which form word line layers, e.g., conductive paths to control gates of the memory cells at the layer, and SG, which forms a select gate layer, e.g., a conductive path to control gates of select gate transistors of NAND strings. The word line layer of FIG. 2A may represent any one of WL0 to WL3, for instance. The conductive layers may include doped polysilicon or metal silicide, for instance. An example voltage of 5-10 V may be applied to the back gate to maintain a conductive state which connects the drain- and source-side columns.

For each block, the word line layer is divided into two word line layer portions 202 and 204. Each block includes a slit pattern. A slit refers, e.g., to a void which extends vertically in the stack, typically from an etch stop layer at the bottom to at least a top layer of the stack. The slit can be filled with insulation to insulate words line layer portions from one another. A slit 206 is a single continuous slit which extends in a zig-zag pattern in the block so that the block is divided into two portions, 202 and 204, which are insulated from one another. This approach can provide greater flexibility in controlling the memory cells since the word line layer portions can be driven independently.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells along a line 220 include C0 to C11. The figure represents a simplification, as many more rows of memory holes will typically be used, extending to the right and left in the figure. Also, the figures are not necessarily to scale. The columns of memory cells can be arranged in subsets such as sub-blocks.

Subsets of memory cells can be of different types, such as WL subsets, SGD line subsets and BL subsets.

Figure 2B:
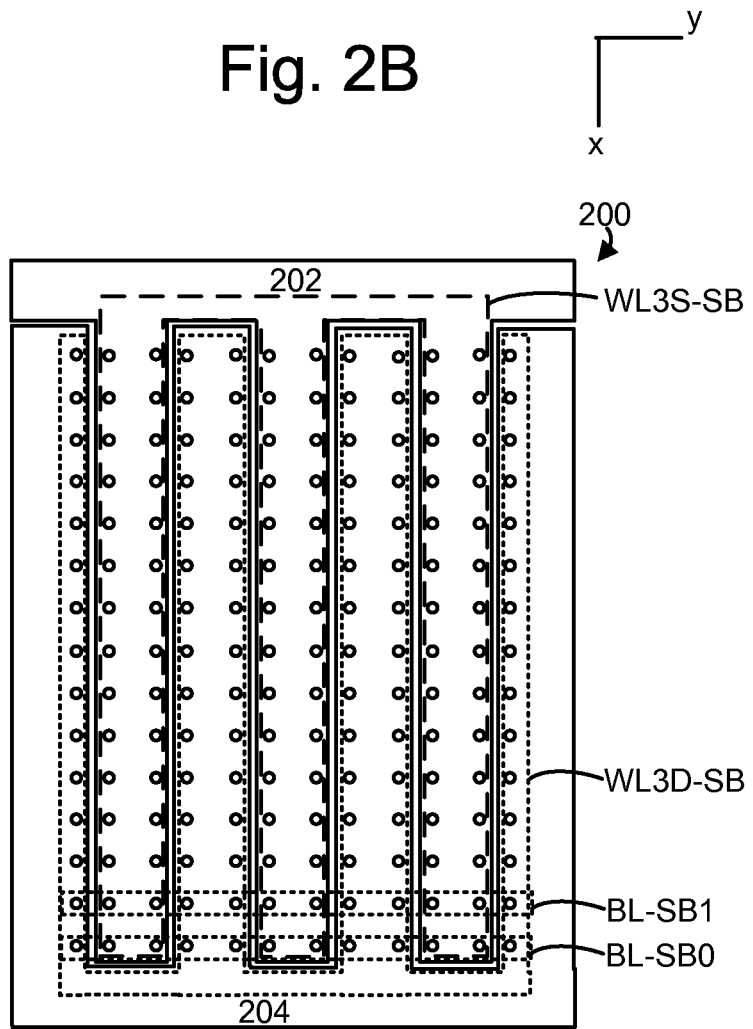
FIG. 2B depicts the block 200 FIG. 2A, showing example word line subsets WL3D-SB and WL3S-SB and example bit line subsets BL-SB0 and BL-SB1.
Figure 2C:
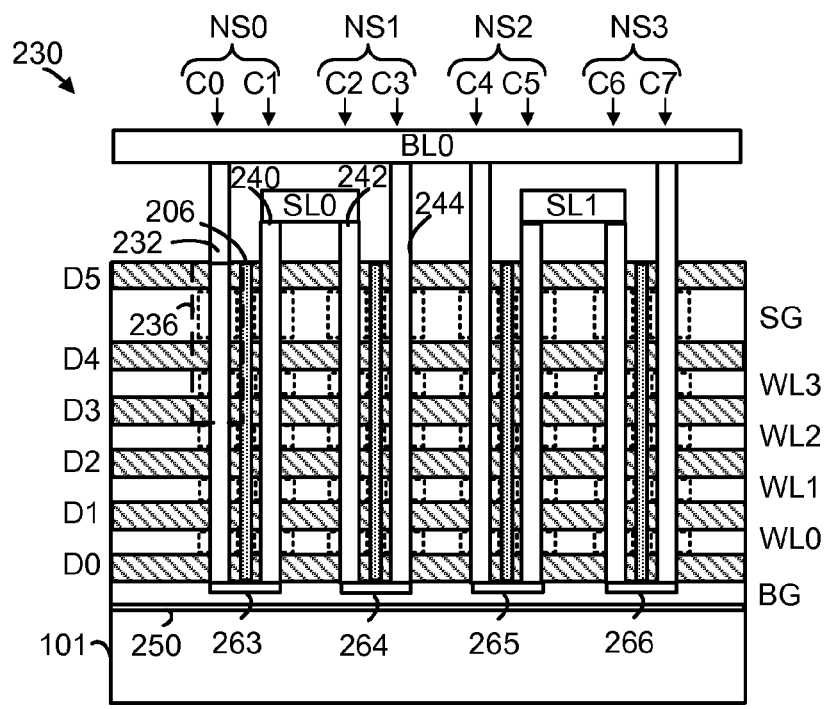
FIG. 2C depicts a cross-sectional view of the portion 210 of the block 200 of FIG. 2A, along line 220.

FIG. 2B depicts the block 200 FIG. 2A, showing example word line subsets WL3D-SB and WL3S-SB and example bit line subsets BL-SB0 and BL-SB1. This example assumes that the WL3 layer is depicted. WL3 S-SB is a word line layer or word line layer portion in communication with one (e.g., exactly one) memory cell in the source-side of each U-shaped NAND string, and WL3D-SB is a word line layer or word line layer portion in communication with one (e.g., exactly one) memory cell in the drain-side of each U-shaped NAND string.

Each subset can be independently inhibited from being erased. For example, a WL subset can be independently inhibited from being erased by floating a voltage of the WL. A SGD line subset can be independently inhibited from being erased by setting a voltage of the SGD line to a sufficiently high (but lower than selected BL bias) level which inhibits erase. If Vdg is small enough not to be able to generate GIDL to charge the unselected channels, the unselected SGD line subset can be inhibited from being erased. Similarly, a BL subset can be independently inhibited from being erased by setting a voltage of the BL to a sufficiently low level which inhibits erase. The term "inhibit erase" or the like refers, e.g., to substantially preventing or not encouraging erase. A "subset" as used herein generally refers to a proper subset. A subset "A" is a proper subset of a set "B" when A⊂B and A≠B. That is, A contains one or more cells which are also contained within B, but A does not contain all cells in B. A contains fewer memory cells than B. Subsets of the same type typically are distinct from one another and do not contain common cells. Subsets of different types can contain one or more common cells.

When U-shaped NAND strings are used, each SGD line subset can include two adjacent rows of columns of memory cells. In a subset, the adjacent rows are separated by the slit. The columns of memory cells on one side of the slit are drain-side columns (e.g., C0, C3, C4 and C7 in FIG. 2C) of NAND strings, and the columns of memory cells on the other side of the slit are source-side columns (e.g., C1, C2, C5 and C6 in FIG. 2C) of the NAND strings. Note that the pattern of two source-side columns between two drain-side columns repeats in the y-direction.

Word line drivers can independently provide signals such as voltage waveforms to the word line layer portions 202 and 204.

The drawings are not to scale and do not show all memory columns. For example, a more realistic block might have 12 memory columns in the y direction as shown, but a very large number such as 32 k memory columns in the x direction, for a total of 384 k memory columns in a block. With U-shaped NAND strings, 192 k NAND strings are provided in this example. With straight NAND strings, 384 k NAND strings are provided in this example. Assume there are four memory cells per column, so there are 384 k×4=1,536 k or 1,536,000 total cells in the set.

A portion 210 of the block 200 is described further below in connection with FIG. 3A.

FIG. 2C depicts a cross-sectional view of the portion 210 of the block 200 of FIG. 2A, along line 220. Columns of memory cells C0 to C7 are depicted in the multi-layer stack. The stack 230 includes the substrate 101, an insulating film 250 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 to 266 which connect the columns. The back gate thus connects the two columns of each U-shaped NAND string. For example, NS0 (NS=NAND string) includes columns C0 and C1 and connecting portion 263. NS0 has a drain end 232 and a source end 240. NS1 includes columns C2 and C3 and connecting portion 264. NS1 has a drain end 244 and a source end 242. NS2 includes columns C4 and C5 and connecting portion 265. NS3 includes columns C6 and C7 and connecting portion 266.

The source line SL0 is connected to the source ends 240 and 242 of two adjacent memory strings NS0 and NS1. The source line SL0 is also connected to other sets of memory strings which are behind NS0 and NS1 in the x direction. Recall that additional U-shaped NAND strings in the stack 230 extend behind the U-shaped NAND strings depicted in the cross-section, e.g., along the x-axis, in a SGD line direction. The U-shaped NAND strings NS0 to NS3 are each in a different SGD line subset, but are in a common BL subset.

The slit 206 from FIG. 2A is also depicted as an example. In the cross-section, multiple slit portions are seen, where each slit portion is between the drain- and source-side columns of a U-shaped NAND string. A portion of the bit line BL0 is also depicted.

Short dashed lines depict memory cells and select gate transistors, as discussed further below. A region 236 of the stack is shown in greater detail in FIG. 3A.

FIG. 3A depicts a close-up view of the region 236 of the column C0 of FIG. 2C, showing a drain-side select gate transistor SGD0 and a memory cell MC303. The region shows portions of the dielectric layers D3 to D5 and the conductive layers WL3 and SG. Each column includes a number of layers which are deposited along the sidewalls of the column. These layers can include oxide-nitride-oxide and polysilicon layers which are deposited, e.g., using atomic layer deposition. For example, a block oxide (BOX) can be deposited as layer 296, a nitride such as SiN as a charge trapping layer (CTL) can be deposited as layer 297, a tunnel oxide (TNL) can be deposited as layer 298, a polysilicon body or channel (CH) can be deposited as layer 299, and a core filler dielectric can be deposited as region 300. Additional memory cells are similarly formed throughout the columns.

When a memory cell is programmed, electrons are stored in a portion of the CTL which is associated with the memory cell. For example, electrons are represented by "−" symbols in the CTL 297 for MC303. These electrons are drawn into the CTL from the channel, and through the TNL. The threshold voltage of a memory cell is increased in proportion to the amount of stored charge.

During an erase operation, as discussed further below, a voltage in the channel is raised due to gate-induced drain leakage (GIDL). The voltage of the one or more selected word line layers is then driven down to a reduced level such as 0 V to create an electric field across the TNL which causes holes to be injected from the memory cell's body to the CTL, resulting in a large Vth downshift toward an erase-verify level, Vv_erase. This process can be repeated in successive iterations until a verify condition is met, as discussed further below. For unselected word lines, the word lines remain at an elevated level so that the electric field across the TNL is relatively small, and no, or very little, hole tunneling will occur. Memory cells of the unselected word lines will experience little or no Vth downshift, and as a result, they will not be erased.

FIG. 3B depicts a cross-sectional view of the column C0 of FIG. 3A. Each layer is ring-shaped in one possible approach, except the core filler, which is cylindrical.

Figure 4B:
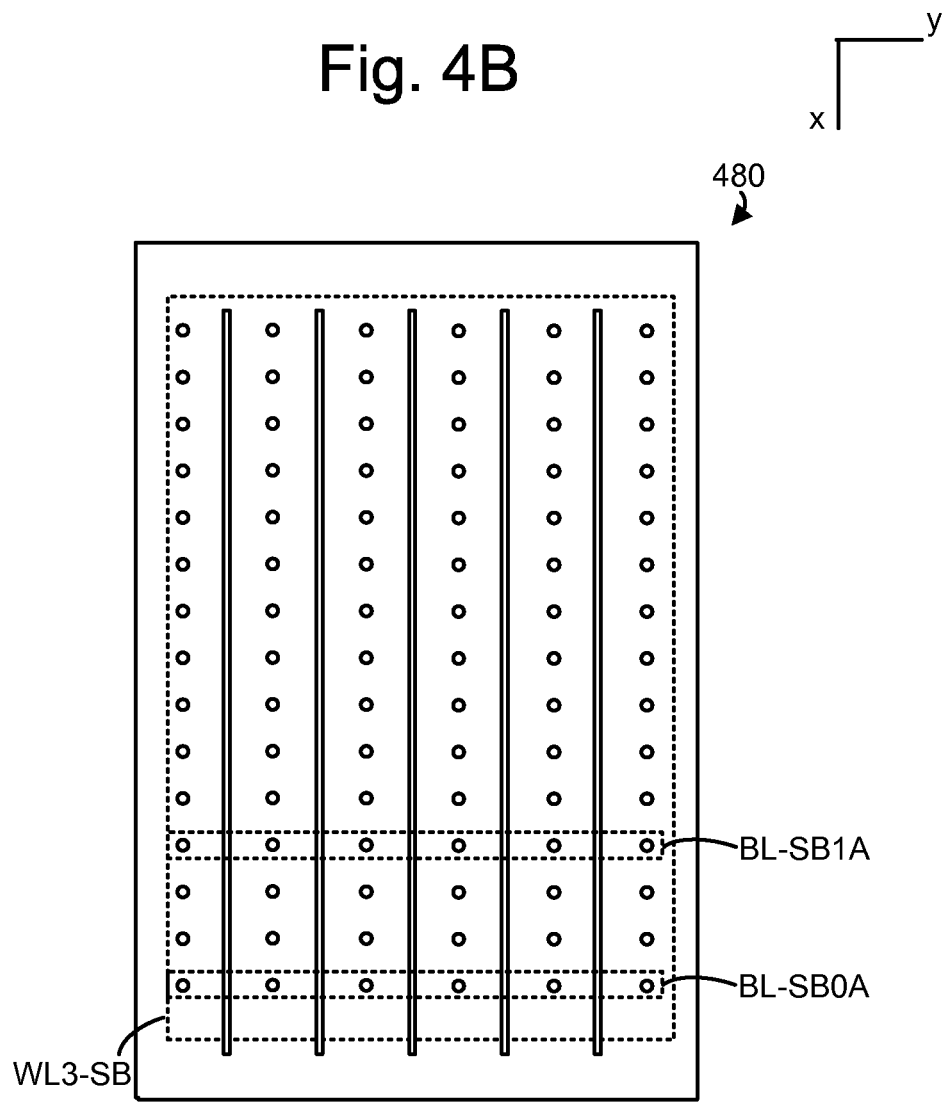
FIG. 4B depicts the block BLK0 of FIG. 4A, showing an example WL line subset WL3-SB and example bit line subsets BL-SB0A and BL-SB1A.

FIG. 4A depicts a top view of a straight NAND string embodiment 480 of the block BLK0 of FIG. 1A, showing example SGD line subsets SGDL-SB0A and SGDL-SB1A. In this configuration, a NAND string has only one column, and the source-side select gate is on the bottom of the column instead of on the top, as in a U-shaped NAND string. Moreover, a given level of a block has one word line layer which is connected to each of the memory cells of the layer. For example, FIG. 4B depicts the block BLK0 of FIG. 4A, showing an example WL line subset WL3-SB and example bit line subsets BL-SB0A and BL-SB1A. A number of slits, such as example slit 482, can also be used. These insulation-filled slits are used in the fabrication process to provide structural support for the stack when undoped polysilicon layers are removed by a wet etch and a dielectric is deposited to form the alternating dielectric layers. A dashed line 486 extends through columns C12 to C17. A cross-sectional view along line 486 of portion 488 is shown in FIG. 4C.

Figure 4C:
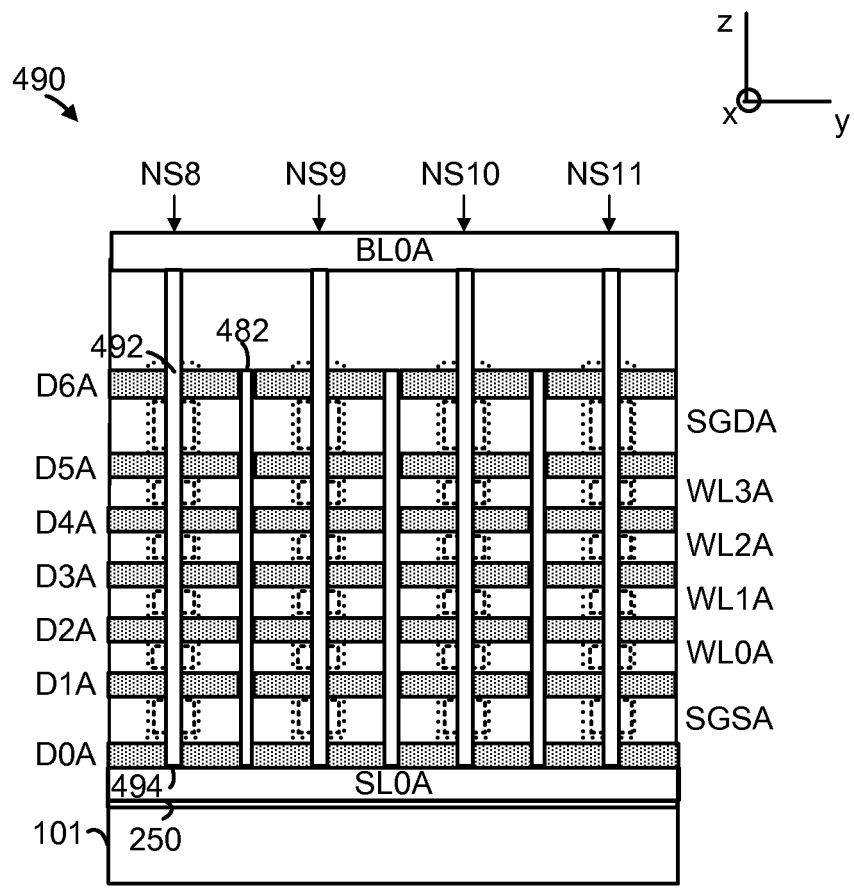
FIG. 4C depicts a cross-sectional view of the portion 488 of the block 480 of FIG. 4A along line 486.

FIG. 4C depicts a cross-sectional view of the portion 488 of the block 480 of FIG. 4A along line 486. Columns of memory cells corresponding to NAND strings NS8 to NS11 are depicted in the multi-layer stack. The stack 490 includes a substrate 101, an insulating film 250 on the substrate, and a portion of a source line SL0A. Recall that the additional straight NAND strings in a SGD line subset extend in front of and in back of the NAND strings depicted in the cross-section, e.g., along the x-axis. NS8 has a source end 494 and a drain end 492. The slit 482 from FIG. 4A is also depicted with other slits. A portion of the bit line BL0A is also depicted. Dashed lines depict memory cells and select gate transistors. The erase techniques described herein can be used with a U-shaped or straight NAND.

FIG. 5A depicts a flowchart of an example erase operation. Step 500 assigns storage elements in a string to groups according to their location along the string. Step 502 performs an erase operation based on the group assignments. Examples of step 502 are provided in FIGS. 5B and 5C. A state machine or other circuit can store the group assignment information.

FIG. 5B depicts a flowchart of an example erase operation according to step 502 of FIG. 5A in which control gate voltages are set differently for different groups of storage elements. Generally, an erase operation can include multiple erase-verify iterations which are performed until a verify condition is met, at which point the erase operation ends. In one approach, the memory device includes NAND strings which have a drain-side select gate (SGD) transistor on one end and a source-side select gate (SGS) transistor on the other end. When an erase voltage is applied to the bit line in a one-sided erase, or to the bit line and source line in a two-sided erase, the select gate transistors generate a sufficient amount of gate-induced drain leakage (GIDL) current to charge up the floating body (channel) of the NAND string. GIDL increases in proportion to the drain-to-gate voltage (Vdg) of the select gate transistors.

Step 510 initializes an erase voltage (Verase) to a starting value, e.g., 20 V. Step 511 charges the channel of string by applying the erase voltage to the string and setting control gate voltages differently for each group to encourage erasing. See FIG. 5H. For example, a control gate voltage at or slightly above 0 V encourages erasing by creating a large potential difference across the tunneling layer, between the channel and the control gate, which encourages further tunneling. See, e.g., FIGS. 7C and 8C for further details. Step 512 performs an erase-verify test for all storage elements in the string. The erase-verify test can be performed concurrently for the different groups. For example, this can involve applying a common erase-verify control gate voltage (Vv_erase) to each control gate while detecting the current through the string. If the current is above a reference current, indicating the string is conductive, the erase-verify test is passed. See, e.g., FIGS. 9A-9C for further details.

Decision step 513 determines if the erase-verify test has passed for the string. If the answer is "yes," the erase operation ends successfully at step 515. If the answer is "no," a decision step 514 determines if Verase is at a maximum allowed level, Verase_max. If the answer is "yes," the erase operation ends unsuccessfully at step 515. If the answer is "no," Verase is stepped up at step 516 and another iteration is performed at step 511.

FIG. 5C depicts a flowchart of another example erase operation according to step 502 of FIG. 5A in which groups of storage elements can be individually inhibited from further erase. Step 520 set status=erase for each group of storage elements in a string. Step 521 initializes an erase voltage (Verase) to a starting value. Step 522 charges the channel of the string by applying the erase voltage to the string, setting a control gate voltage for each group with status=erase to encourage erasing, and floating or setting a control gate voltage for each group with status=inhibit to discourage erasing. For example, a control gate voltage at a relatively high level (e.g., 10-15 V) discourages erasing by creating a small potential difference across the tunneling layer.

Step 523 perform an erase-verify test for each group with status=erase. The control gate voltages can be common for each group of the different groups and the erase-verify test can be performed one group at a time for the different groups. The erase-verify test is not performed for each group with status=inhibit. Step 524 sets status=inhibit for one or more groups of the different groups which pass the erase-verify test. The erase status=erase is continued for remaining groups of the different groups which do not pass the erase-verify test. Decision step 525 determines if all groups in the string passed the erase-verify test. If the answer is "yes," the erase operation ends successfully at step 527. If the answer is "no," a decision step 526 determines if Verase is at Verase_max. If the answer is "yes," the erase operation ends unsuccessfully at step 527. If the answer is "no," Verase is stepped up at step 528 and another iteration is performed at step 522.

Optionally, the technique of FIG. 5B can be modified so that per-group erase-verify and inhibit can occur as discussed in connection with FIG. 5C.

Figure 5D:
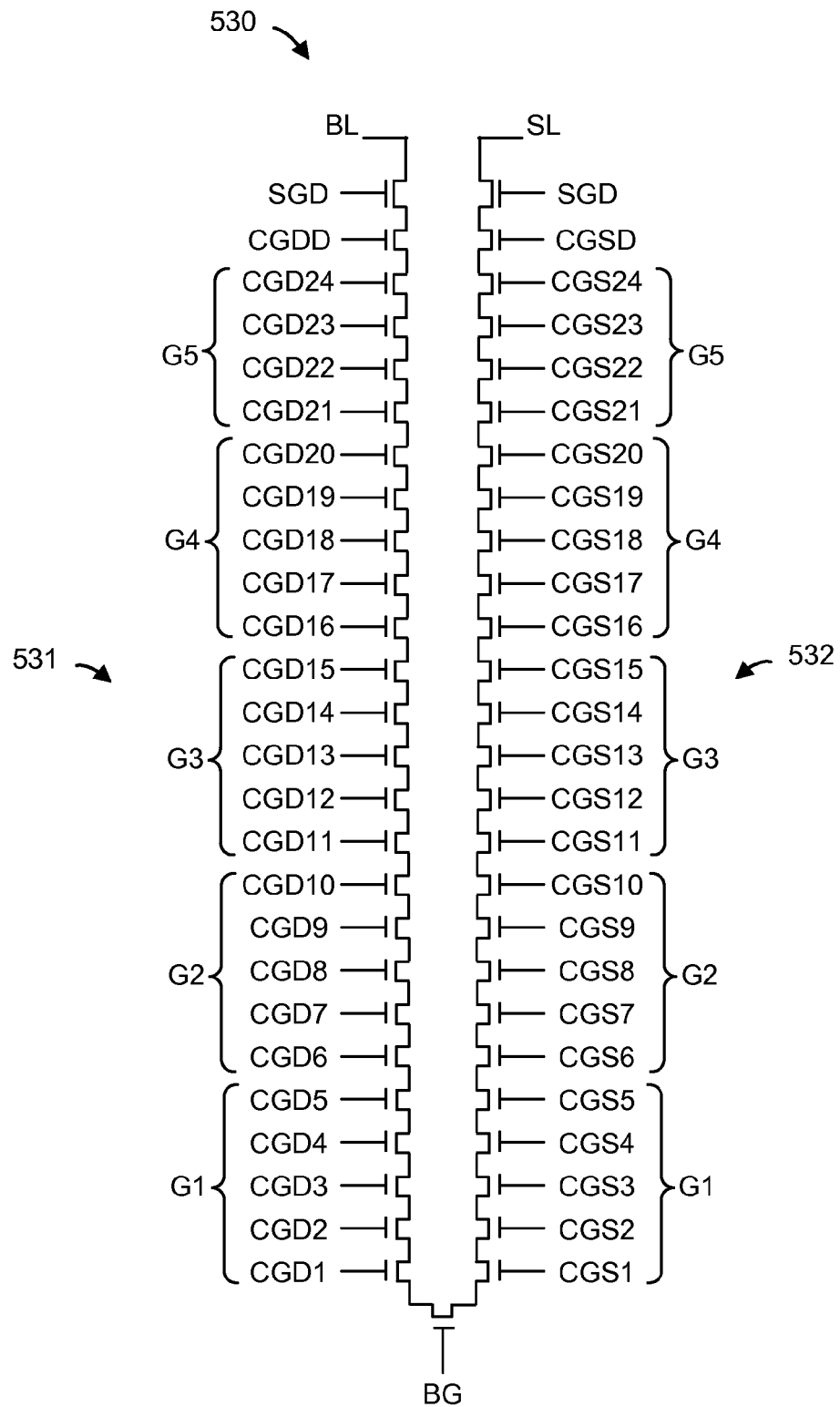
FIG. 5D depicts an example assignment of storage elements to groups along a string, where a two-sided erase operation is used.

FIG. 5D depicts an example assignment of storage elements to groups along a string, where a two-sided erase operation is used. An example NAND string 530 has a drain side 531 which extends between a bit line (BL) and a back gate (BG) and a source side 532 which extends between a source line (SL) and the BG. The drain side includes a SGD transistor, a dummy transistor (CGDD) and storage elements represented by control gates CGD1-CGD24. The source side includes a SGS transistor, a dummy transistor (CGSD) and storage elements represented by control gates CGS1-CGS24.

One or more dummy transistors on each side can be used to avoid disturbs. One or more dummy transistors can optionally be provided between groups as well.

In this example, a two-sided erase is used and the storage elements are assigned to groups G1-G5. It is assumed that the drain side and source side storage elements have a similar erase speed due to their common distance from a drive end (the bit line or source line end) of the NAND string.

Each group includes storage elements on the drain and source sides. However, other approaches are possible. Specifically, CGD1-CGD5 and CGS1-CGS5 are in G1, CGD6-CGD10 and CGS6-CGS10 are in G2, CGD11-CGD15 and CGS11-CGS15 are in G3, CGD16-CGD20 and CGS16-CGS20 are in G4, and CGD21-CGD24 and CGS21-CGS24 are in G5. The groups are mostly equal in size although this can vary as well. The group assignments can be made by grouping storage elements which are expected to have a common erase speed. Typically, a group will include multiple adjacent storage elements.

Figure 5E:
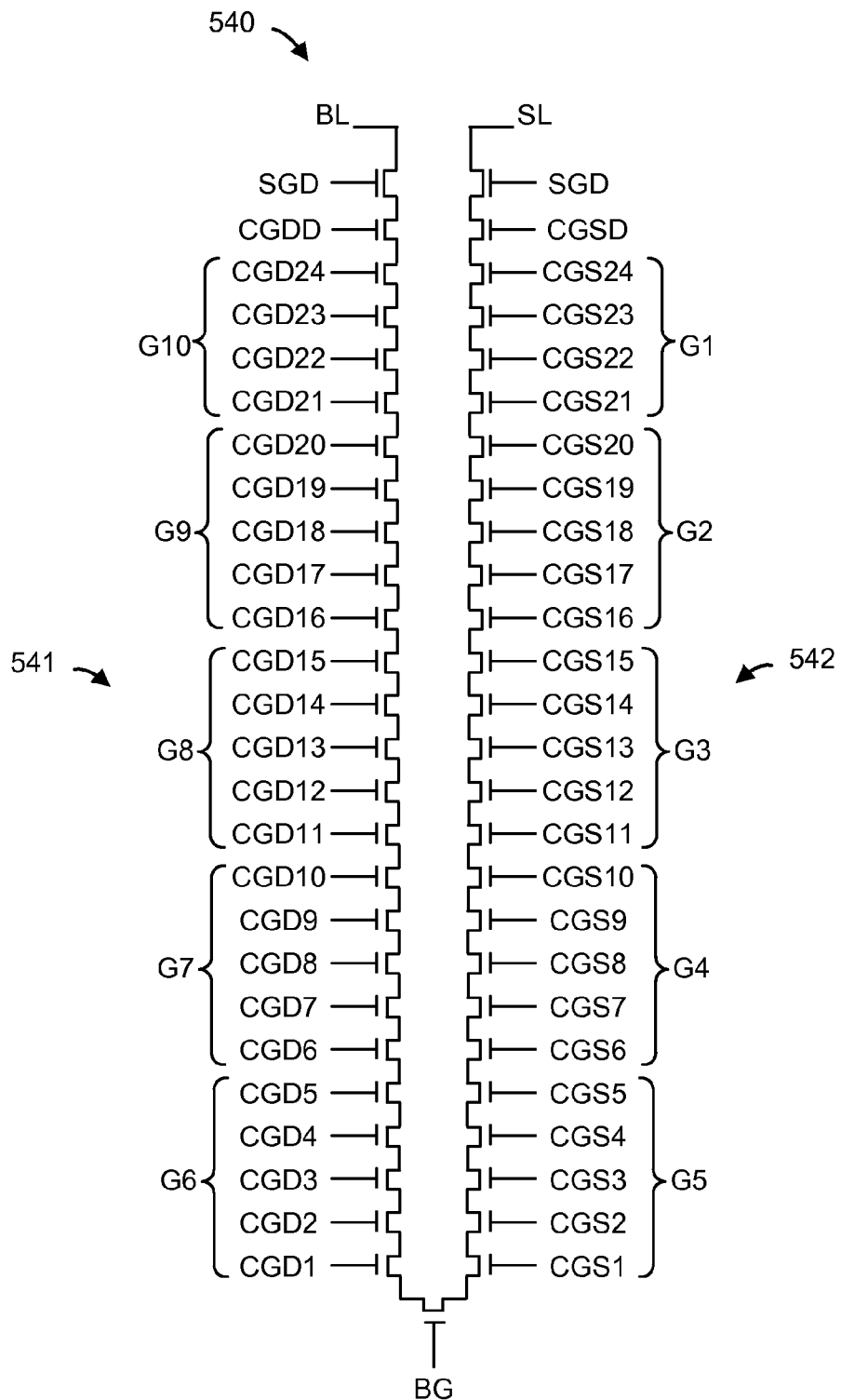
FIG. 5E depicts an example assignment of storage elements to groups along a string, where a one-sided erase operation is used.

FIG. 5E depicts an example assignment of storage elements to groups along a string, where a one-sided erase operation is used. An example NAND string 540 has a drain side 541 and a source side 542. Since a one-sided erase is used and the bit line is the driven end, it is assumed that the source side storage elements will have a slower erase speed since they are furthest from the driven end. Accordingly, they are assigned to separate groups. Specifically, CGS21-CGS24 are in G1, CGS16-CGS20 are in G2, CGS11-CGS15 are in G3, CGS6-CGS10 are in G4, CGS1-CGS5 are in G5, CGD1-CGD5 are in G6, CGD6-CGD10 are in G7, CGD11-CGD15 are in G8, CGD16-CGD20 are in G9, and CGD21-CGD24 are in G10.

Here, the string is U-shaped. The groups extend from one end of the string (e.g., the BL or SL end) to the back gate of the string. The groups also extend from one end of the string (e.g., the BL or SL end) to the opposing end of the string (e.g., the SL or BL end). Optionally, the string is straight and the groups extend from one end of the string (BL or SL end) to an opposing end of the string (SL or BL end).

Figure 5F:
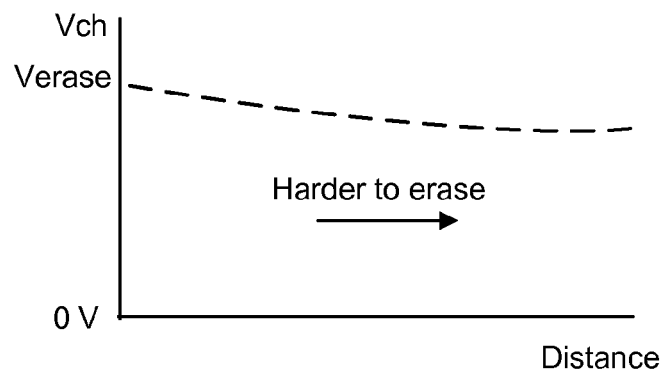
FIG. 5F depicts a local potential drop in a channel of a string in an erase operation based on a distance from a driven end of the string.

FIG. 5F depicts a local potential drop in a channel of a string in an erase operation based on a distance from a driven end of the string. As mentioned, the channel potential can decrease further from a driven end during an erase operation. The x-axis depicts a distance from a driven end and the y-axis depicts the channel voltage, Vch, relative to Verase. For two-sided erase, the storage elements of CGD1 and CGS1 in FIG. 5D are furthest from the bit line and source line, respectively. For one-sided erase, the storage element of CGS24 in FIG. 5E is furthest from the bit line. As mentioned, a larger potential drop makes it harder to erase the storage elements.

Figure 5G:
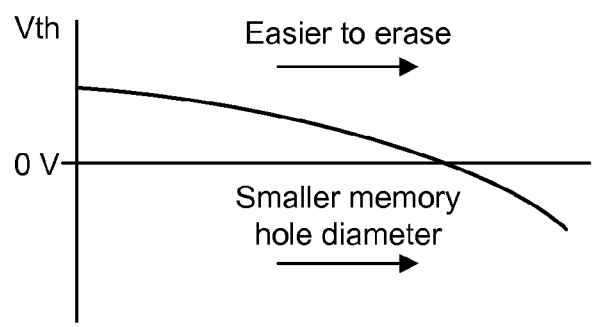
FIG. 5G depicts variations in an erase depth along a string based on variations in memory hole diameter along the string.

FIG. 5G depicts variations in an erase depth along a string based on variations in memory hole diameter along the string. As mentioned, it is easier to erase a storage element which is at a part of the memory hole which has a smaller diameter. The x-axis depicts a memory hole diameter and the y-axis depicts a threshold voltage Vth level of the storage elements. The Vth level indicates an erase depth such that a lower Vth indicates a deeper erase or an easier to erase storage element. This data was obtained by applying an erase pulse of fixed amplitude and duration to each storage element and measuring the resulting Vth of the storage element.

Figure 5H:
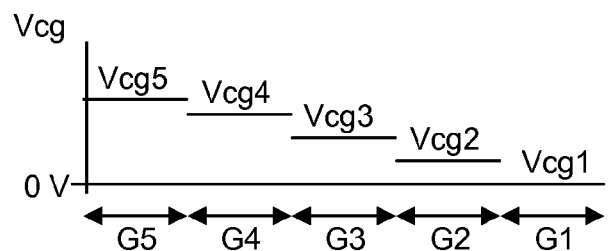
FIG. 5H depicts control gate voltages for different groups of storage elements in an erase operation.

FIG. 5H depicts control voltages for different groups of storage elements in an erase operation. In this example, five groups G1-G5 are depicted. The x-axis depicts a group number and the y-axis depicts a control gate voltage (Vcg) (an absolute level or an offset amount from an absolute level). Five levels, Vcg1-Vcg5, are depicted. By providing a higher control gate voltage for a group which has a faster inherent erase speed, its erase speed can be slowed down and equalized with the other groups, resulting in a tighter erase distribution. In one approach, the levels of Vcg are a function of distance from a driven end of a NAND string although other variations are possible. For example, Vcg could increase and then decrease, or decrease and then increase, a function of the distance from the driven end. Moreover, the levels of Vcg can be equally spaced or unequally spaced. An optimal assignment of group composition and Vcg level for a group can be determined from tests. A reasonable approximation is to have Vcg be smaller further from a driven end, and larger closer to a driven end. In one approach, Vcg=0 is the lowest level and the other levels are higher, e.g., up to a few Volts (e.g., up to 2-5 V).

The control gate voltages are therefore different for each group of the different groups and common within each group.

For each group, the control gate voltage can be a function of a distance of the group from one end of the string. In one approach, the control gate voltage decreases with a distance of the group from the one end of the string. This is useful, e.g., when the erase speed is slower with the distance. In one approach, the control gate voltage decreases by progressively smaller increments as a function of a distance of the group from the one end of the string. This is useful, e.g., when the erase speed decreases by progressively smaller increments as a function of the distance. In one approach, the control gate voltage becomes smaller and then larger as a function of a distance of the group from the one end of the string. This is useful, e.g., when the erase speed becomes smaller and then larger as a function of the distance. In one approach, a number of the storage elements in the groups is progressively larger as a function of a distance of the group from the one end of the string. This is useful, e.g., when the erase speed is similar for relatively more storage elements as a function of the distance. For instance, a large group of storage elements further from a driven end may have a similar erase speed so that it is appropriate to group them.

Figure 6A:
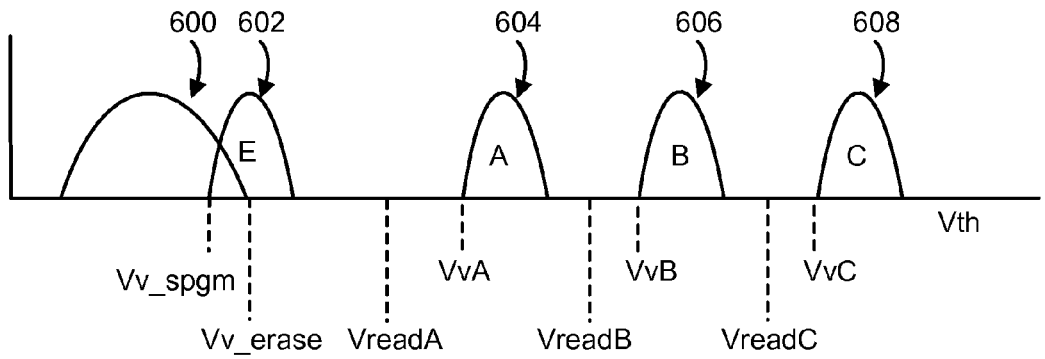
FIG. 6A depicts threshold voltage distributions of a deep erased state, a final erased state and higher data states of one example erase operation.

FIG. 6A depicts threshold voltage distributions of a deep erased state, a final erased state and higher data states of one example erase operation. Storage elements can be programmed so that their threshold voltages are in respective ranges which represent data states. Initially, an erase operation is performed which places all of the storage elements in the erased state (E). Subsequently, some of the storage elements can be programmed to a higher threshold voltage such as to represent the A, B or C data states.

The x-axis indicates a threshold voltage and the y-axis indicates a number of storage elements. In this example, there are four data states (each represented by a threshold voltage distribution): an initial (deep) erased state distribution 600, a soft programmed erased state (E) distribution 602, an A state distribution 604, a B state distribution 606 and a C state distribution 608. Memory devices with additional data states, e.g., eight or sixteen data states, can also be used. The distribution 600 is realized after the erase operation when storage elements are typically over-erased, past the erase state distribution 602. In the erase operation, one or more erase pulses are applied to the NAND string at its source and/or drain ends, until the threshold voltage of the storage elements being erased transitions below an erase-verify level, Vv_erase which can be 0 V or close to 0 V, in one approach. Once the erase operation is completed for a block, the soft programming operation can be performed, in which one or more positive voltage pulses are applied to the control gates of the storage elements, such as via a word line, to increase the threshold voltages of some or all of the storage elements in the distribution 600 above a soft programming (SPGM) verify level, Vv_spgm, to the erased state distribution 602. This avoids a deep erased state.

The soft programming operation advantageously results in a narrow erase state distribution 602. Once the soft programming operation is complete, programming to higher data states can occur, such as to states A, B and C using verify levels VvA, VvB and VvC, respectively. A subsequent read operation can use the levels VreadA, VreadB and VreadC.

Figure 6B:
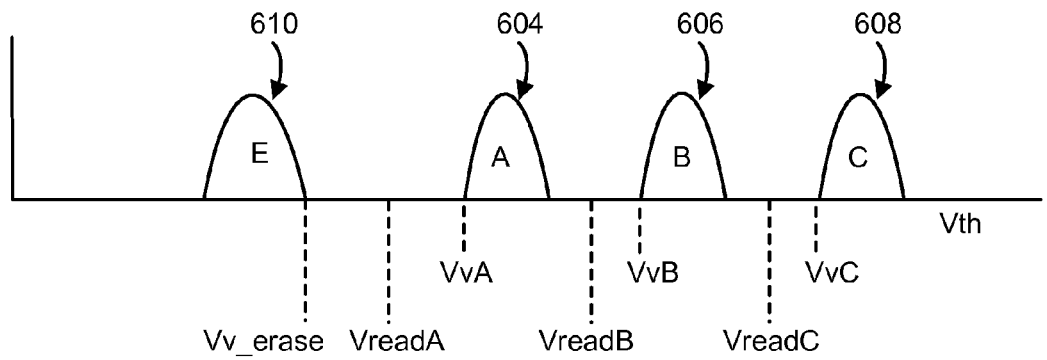
FIG. 6B depicts threshold voltage distributions of a soft erased state and higher data states of another example erase operation.

FIG. 6B depicts threshold voltage distributions of a soft erased state and higher data states of another example erase operation. In this approach, the erase state distribution 610 is reached after a soft erase. In one option, no soft programming is performed. Vv_erase can be the same or different in FIGS. 6A and 6B.

The erase techniques discussed herein can be used in the erase operations of FIGS. 6A and 6B, as an example.

Figure 6C:
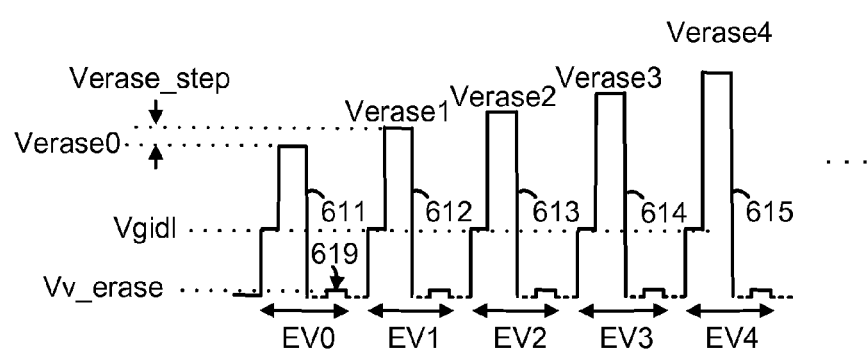
FIG. 6C depicts a series of erase pulses and verify pulses in an erase operation, where Verase is stepped up in successive erase-verify iterations.

FIG. 6C depicts a series of erase pulses and verify pulses in an erase operation, where Verase is stepped up in successive erase-verify iterations. A waveform 620 represents a number of erase-verify iterations EV0, EV1, EV2, . . . . Each erase-verify iteration includes an erase pulse 611-615 (erase portion) followed by a verify pulse such as 619 of magnitude Vv_erase (erase-verify portion). The erase pulses have two levels. A first level is Vgidl and a second level is Verase. In this example, Verase is stepped up in each iteration by a step size Verase_step so that erase pulse 611 has a peak amplitude of Verase0, erase pulse 612 has a peak amplitude of Verase1, erase pulse 613 has a peak amplitude of Verase2, erase pulse 614 has a peak amplitude of Verase3, and erase pulse 615 has a peak amplitude of Verase_max, a maximum allowed level of Verase. In this case, the maximum erase voltage is reached relatively soon in the erase operation. Vgidl can be fixed in each erase pulse or varying, such as by stepping up with each erase pulse. Each erase pulse corresponds to the waveform in FIG. 7A or 8A.

Consider an example corresponding to FIG. 5C in which each group can be inhibited separately. At a start of one erase-verify iteration such as EV0, the erase status=erase for each group. Based on the erase-verify portion of EV0, erase status=inhibit for one or more groups of the different groups which pass the erase-verify test, and erase status=erase for remaining groups of the different groups which do not pass the erase-verify test. The charging of the channel and the setting of the control gate voltages occur in an erase portion of the one erase-verify iteration. In the erase portion of a subsequent erase-verify iteration such as EV1, for the one or more groups which have the erase status=inhibit, the erase operation can include floating the control gate voltages, or driving the control gate voltages at a level which discourages erasing of storage elements in the one or more groups and, for the remaining groups of the different groups which do not pass the erase-verify test, setting the control gate voltages at a level which encourages erasing of storage elements in the one or more groups. Moreover, for each group, the erase-verify test is performed by applying an erase-verify control gate voltage (Vv_erase) to storage elements in the group and applying a pass voltage (Vcg_unselected) to storage elements in remaining groups while detecting a current through the string, where the erase-verify control gate voltage is common among the groups.

FIG. 7A-7E depicts example voltages during the erase portion of an erase-verify iteration of an erase operation. An erase operation can include multiple erase-verify iterations, e.g., EV0, EV1, EV2, . . . such as discussed in connection with FIG. 6C. Each erase-verify iteration can include an erase portion followed by an erase-verify portion. Moreover, each erase portion can have multiple levels. In one approach, a two-level erase portion is used. Further, an erase operation can involve a one-sided or a two-sided erase. A one-sided erase applies a voltage to the drain-end of a NAND string via a bit line to charge up the NAND string, while the source-end of the NAND string is not used to charge up the NAND string. A two-sided erase charges up a NAND string via both the drain-end and the source-end. Two-sided erase is faster than one-sided erase but requires a larger chip size. Generally, the erase portion can include a pre-charge phase (t1-t3) and an erase phase (t3-t6).

FIGS. 7A-7E have a common time axis but the time increments are not necessarily equally spaced and the figures are not necessarily to scale. Moreover, the voltage levels provided are examples only as other values can be used.

Figure 7A:
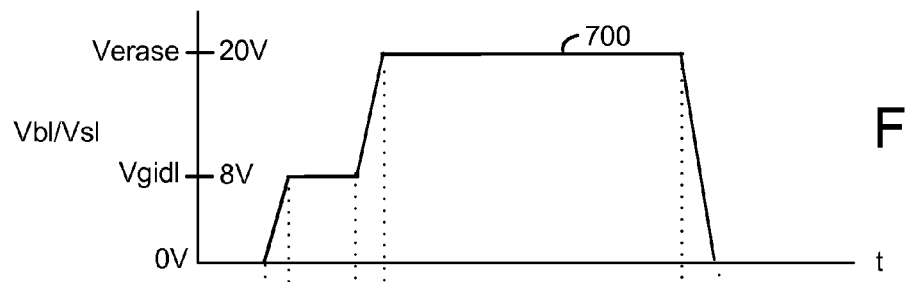
FIGS. 7A-7E depict example voltages during the erase portion of an erase-verify iteration of an erase operation according to FIG. 5B.

FIG. 7A depicts example voltages for a bit line and source line in a two-sided erase. A selected bit line or source line is in communication with one or more NAND strings having storage elements which are to be erased in the current erase iteration. Waveform 700 depicts Vbl and Vsl (two-sided erase) initially at 0 V (Vss), then being raised to Vgidl (a pre-charge voltage) (e.g., 8 V) from t1-t2, then being raised to Verase (e.g., 20 V) from t3-t4, then returning to 0 V from t6-t7. For one-sided erase, Vsl is raised to a reduced level such as 14 V, for instance, from t5-t6, and provided at 2 V at t2-t3

When Vbl is at Vgidl, holes are generated at the SGD drain edge so that the channel is charged from the bit line end of the NAND string. Similarly, when Vsl is at Vgidl, holes are generated at the SGS drain edge so that the channel is also charged from the source line end of the NAND string. Vgidl is a voltage which is at or above a minimum voltage for creating GIDL. When Vbl is raised to Verase, charging of the channel continues from the bit line end. Similarly, when Vsl is raised to Verase, charging of the channel continues from the source line end.

Figure 7B:
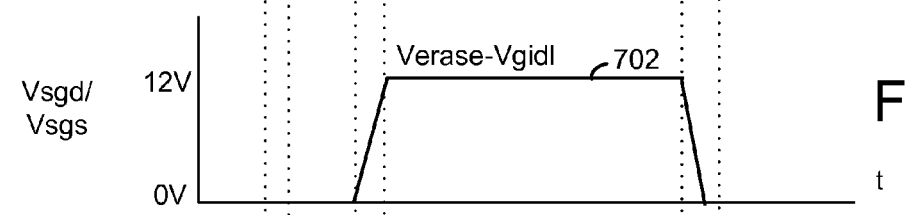

FIG. 7B depicts example voltages for SGD and SGS transistors. From t2-t3, with Vbl at 8 V and Vsgd and/or Vsgs at 0 V, the junction of the SGD and/or SGS transistor is reversed biased at Vgidl (the potential difference between Vbl and/or Vsl and Vsgd). As a result, electron-hole pairs will be generated near the bit line and/or source line junctions. Electrons will be swept away by the electrical field and collected at the bit line and/or source line terminals; while holes will drift to the channel and help to charge up the channel. That is, the electrons will drift toward a high potential (e.g., at the BL or SL), while the holes will drift toward a low potential. Given a sufficiently long pre-charge time, the channel will be boosted close to Vgidl.

From t4-t6 (waveform 702), Vsgd and/or Vsgs (selected string) is raised to Verase−Vgidl (e.g., 20−8=12 V). Since Vbl and/or Vsl is raised to Verase at this time, the junction of the SGD and/or SGS transistor is still reversed biased at Vgidl (since Verase−(Verase−Vgidl))=Vgidl. As a result, electron-hole pairs will continue to be generated and the channel will be charged to a higher potential.

For an unselected string, Vsgd and/or Vsgs is raised to Verase−Vrev (e.g., 20−2=18 V). Vrev is a reverse bias such as 2 V which is maintained on the select gate. For one-sided erase of an unselected string, Vsgd is raised to Verase−Vrev (e.g., 20−2=18 V).

Figure 7C:
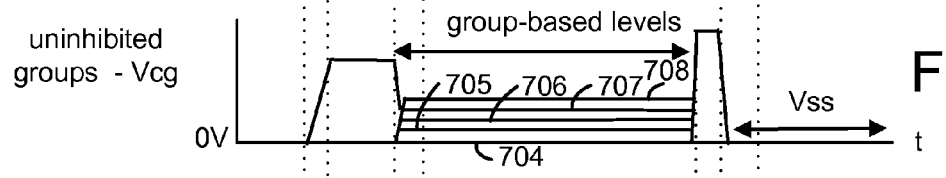

FIG. 7C depicts example control gate voltages for different groups of storage elements. The control gate voltages, which are also word line voltages, can be floated or driven at a level such as 8 V from t2-t3, then driven lower to a reduced level according to their group assignment as represented by waveforms 704-708. For example, consistent with FIG. 5H, waveform 704 represents ΔVcg1=0 V, waveform 705 represents ΔVcg2, waveform 706 represents ΔVcg3, waveform 707 represents ΔVcg4, and waveform 708 represents ΔVcg5. Optionally, the control gate voltages can be driven at Vss (0 V) from t2-t3 and then set to the levels according to their group assignment. Optionally, the voltages can be raised again to a higher level such as 12 V from t6a-t6 after erasing has occurred.

The control gate voltages from t2-t3 and from t6a-t6 are configured at a level which discourages erase of the associated storage elements, while the control gate voltages from t3-t6a are configured at a level which encourages erase of the associated storage elements. To discourage erase of a storage element, the control gate voltage should be sufficiently high to discourage tunneling of holes into a charge trapping layer of the storage element. To encourage erase of a storage element, the channel voltage should be sufficiently higher than the control gate voltage to encourage tunneling.

In either case, the control gate voltages can be at a level which encourages charging of the channel through GIDL throughout the erase operation. For example, the control gate voltages from t2-t3 can be floated or driven at a level such as 8 V which is to minimize reverse bias stress on a memory cells' junction. Specifically, when Vbl is biased at 8 V to pre-charge the channel, the maximum channel potential is 8 V. If Vwl/Ncg is biased at 8 V, memory cell's junction sees 0 V. Because the maximum channel potential is 8 V, the channel potential is not high enough to erase the memory cell. Therefore, we bias Vcg at 8V at that time to minimize the reverse bias stress time on a memory cell's junction. Also, the control gate voltages from t6a-t6 can be floated or driven at a level such as 12 V which is large enough to generate GIDL at the gated junctions of the control gates, even though erase of the associated storage elements is discouraged. For example, if Vbl=20 V and Vcg=12 V, the gated junction bias is 8 V which is large enough to generate GIDL without causing further erasing.

The control gate voltages can be driven at Vss from t6-t7.

The control gate level before the erase period may be lower than after the erase period as shown (e.g., 8 V vs. 12 V) to avoid soft programming of the storage elements which could occur when the channel potential is low.

Note that the control gate voltages are the same as respective word line voltages since each control gate is electrically connected to a respective word line.

Figure 7D:
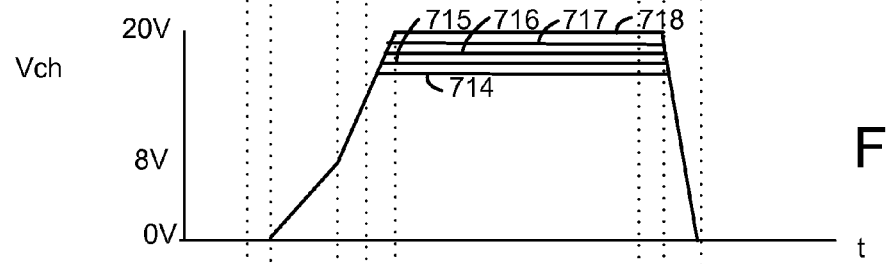

FIG. 7D depicts example channel voltages for the different groups of storage elements. As a simplification, the different levels of Vch represent the different potential drops in the channel based on the distance from the driven end. For example, waveforms 714-718 correspond to waveforms 704-708, respectively, in FIG. 7C. The smallest potential drop corresponds to waveform 718. To slow down the erase speed of the associated storage elements, the highest Vcg is used (waveform 708). The largest potential drop corresponds to waveform 714. To avoid any further slow down of the erase speed of the associated storage elements, Vcg=0 V is used (waveform 704). Intermediate levels of Vcg correspond to the intermediate levels of Vch.

Figure 7E:
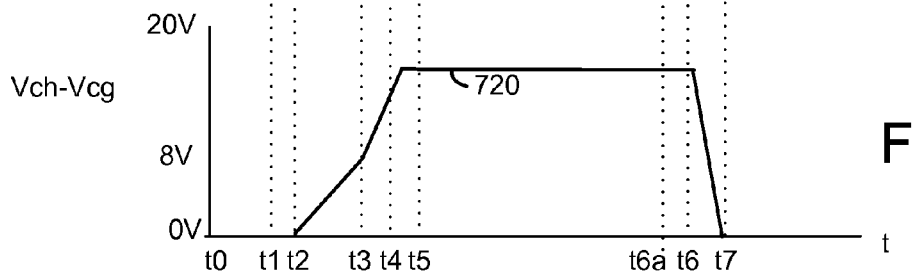

FIG. 7E depicts a difference between the channel voltages of FIG. 7D and the control gate voltages of FIG. 7C. Waveform 720 indicates that the difference is uniform for the different groups of storage elements, so that they can be uniformly erased with a tight Vth distribution.

FIGS. 8A-8D depict example voltages during the erase portion of an erase-verify iteration of an erase operation according to FIG. 5C.

FIG. 8A depicts example voltages for a bit line and source line in a two-sided erase. Waveform 800 may be the same as waveform 700 in FIG. 7A.

FIG. 8B depicts example voltages for SGD and SGS transistors. Waveform 802 may be the same as waveform 702 in FIG. 7B.

FIG. 8C depicts example control gate voltages for uninhibited and inhibited groups of storage elements. In this example, the control gate voltages are the same for the different groups of uninhibited storage elements which are being erased (and have status=erase) in a given iteration. The control gate voltages can be set to 0 V, for instance, from t4-t6 (waveform 805) to encourage further erasing of the associated storage elements.

For the inhibited groups (status=inhibit), the control gate voltages can be set to an inhibit level (Vinhibit) or floated (waveform 806) to discourage further erasing of the associated storage elements. Specifically, for an unselected word line, the control gate can be floated or driven at a higher bias such as 12 V. If the channel potential reaches 20 V during erase, the WL is biased at 12 V. Therefore, the gated junction of a data WL sees 8 V, which is large enough to generate GIDL to help expedite charging up the channel to speed up the erasing of the remaining groups of storage elements with status=erase. During the pre-charge step, an unselected WL can be biased at Vgidl, which is the same as Vbl.

Remaining aspects of FIG. 8C are similar to FIG. 7C.

FIG. 8D depicts example channel voltages for the different groups of storage elements. As a simplification which aids understanding, assume that there are five erase-verify iterations performed and that one group of storage elements passes the erase-verify test in each iteration. Specifically, G1, G2, G3, G4 and G5 pass the erase-verify test at t5a, t5b, t5c, t5d and t6, respectively. As each group is inhibited in the next iteration, Vch increases since the group is no longer diverting holes from the channel and may begin to generate holes for use by the remaining groups of storage elements with status=erase. Waveform 808 represents G5 which experience no drop in Vch. Waveforms 809, 810, 811 and 812 represent G4, G3, G2 and G1, respectively, which experience successively higher drops in Vch. Further, the Vch level increases for each group when a previous group is inhibited.

Figure 9A:
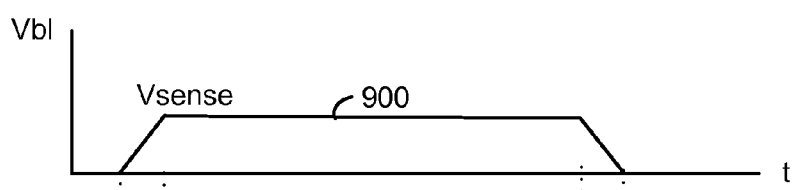
FIGS. 9A-9C depict voltages in the verify portion of an erase-verify iteration of an erase operation.
Figure 9B:
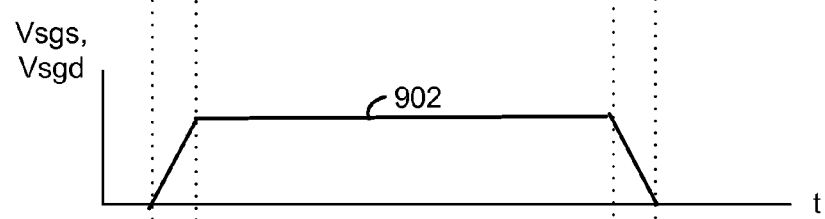
Figure 9C:
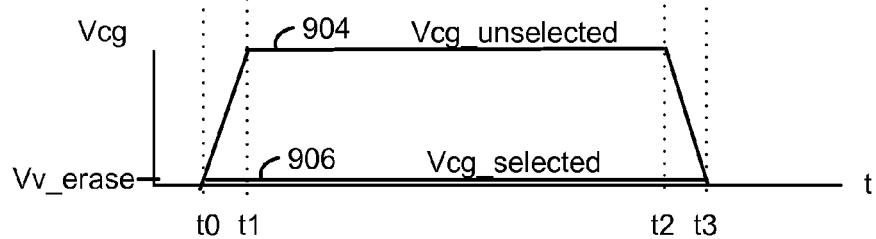

FIGS. 9A-9C depict voltages in the verify portion of an erase-verify iteration of an erase operation. FIG. 9A depicts a bit line voltage 900. FIG. 9B depicts a SGS transistor and SGD transistor voltage 902. FIG. 9C depicts an unselected word line voltage 904 and a selected word line voltage 906. During the verify portion, the selected sets of NAND strings are sensed using sensing circuitry to determine whether the threshold voltages of the selected memory cells have passed the verify test. During the sensing, Vbl is set to a sense voltage, Vsense. Vsgs and Vsgd are set to a level which renders them conductive. Vsgs and Vsgd can be set to the same or different levels. Vcg_unselected is a pass voltage which is set to a sufficiently high level, e.g., 8 V, to render the unselected memory cells in a conductive state. Vcg_selected is set to Vv_erase. Sensing circuitry connected to a NAND string senses whether the NAND string is in a conductive state, which indicates the selected memory cells of the NAND string have been erased and therefore pass the verify test.

As mentioned, in the approach of FIG. 5B, all of the groups in a string can be subject to the erase-verify test at the same time such that all of the groups either pass or fail the erase-verify test. This approach avoids storing data to keep track of the status separately for each group. A disadvantage is that additional iterations may be needed so that a higher Verase is used and some storage elements may be over erased. In the approach of FIG. 5C, each group in a string is subject to the erase-verify test separately such that each group can pass or fail the erase-verify test.

FIGS. 9A-9C have a common time axis but the time increments are not necessarily equally spaced and the figures are not necessarily to scale.

Figure 10A:
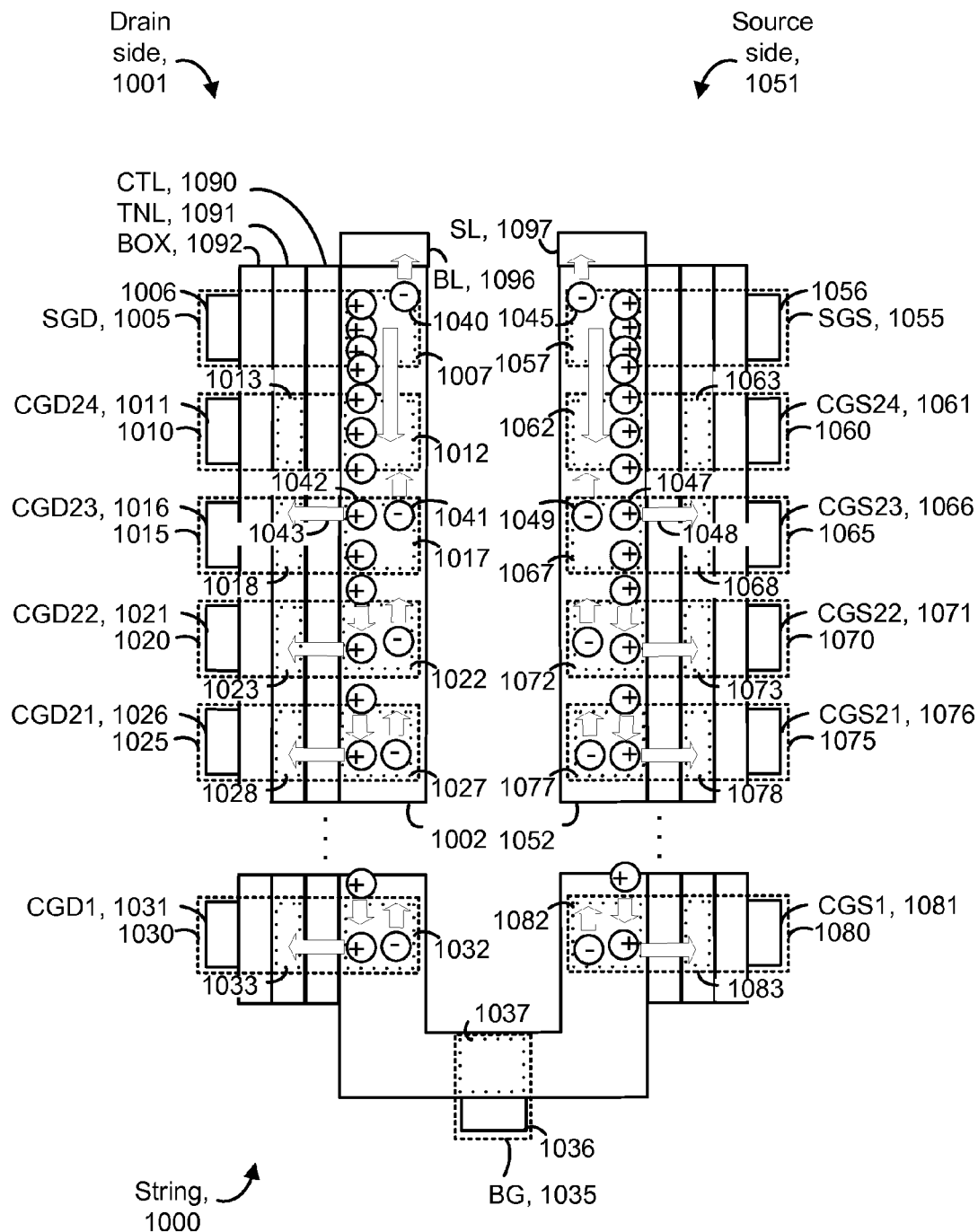
FIG. 10A depicts the movement of holes and electrons in a U-shaped NAND string during a two-sided erase.

FIG. 10A depicts the movement of holes and electrons in a U-shaped NAND string during a two-sided erase. Consistent with the previous discussions, an example U-shaped NAND string 1000 includes a drain side 1001 and a source side 1051. The drain side includes a channel layer 1002 connected to a bit line 1096 which continues as a channel layer 1052 on the source side connected to a source line 1097. A charge trapping layer (CTL) 1090, a tunnel layer (TNL) 1091 and a block oxide (BOX) 1092 are ring shaped layers which extend around the memory hole of the string. Different regions of the channel layers represent channel regions which are associated with respective storage elements or select gate transistors. These channel regions are at a same height and stack level in the stacked memory device as the control gates of the storage elements or select gate transistors.

The drain side includes a SGD transistor 1005 with a control gate 1006 and a channel region 1007. The drain side also includes storage elements 1010, 1015, 1020, 1025 and 1030, control gates 1011, 1016, 1021, 1026 and 1031, CTL regions 1013, 1018, 1023, 1028 and 1033, and channel regions 1012, 1017, 1022, 1027 and 1032, respectively.

The source side includes a SGS transistor 1055 with a control gate 1056 and a channel region 1057. The source side also includes storage elements 1060, 1065, 1070, 1075 and 1080, control gates 1061, 1066, 1071, 1076 and 1081, CTL regions 1063, 1068, 1073, 1078 and 1083, and channel regions 1062, 1067, 1072, 1077 and 1082, respectively.

A back gate 1035 has a control gate 1036 and a channel region 1037.

Representative holes are depicted in the channel layers as circles with a "+" sign and representative electrons are depicted in the channel layers as circles with a "−" sign. As discussed previously, electron-hole pairs are generated by a GIDL process. Initially, during an erase operation, the electron-hole pairs are generated at the SGD and SGS transistors. The holes move away from the driven ends, thereby charging the channel. The electrons move toward the bit line due to the positive charge there. Subsequently, during the erase period of each storage element, additional holes are generated by GIDL at junctions which are formed in the channel for the storage element. However, holes are also removed from the channel as they tunnel to the CTL regions.

Electrons are also generated by the GIDL process. Initially, during the erase operation, the electrons are generated at the SGD and SGS transistors and move toward the driven ends. Subsequently, during the erase period of each storage element, additional electrons are generated by GIDL at junctions which are formed in the channel for the storage element.

In the drain side, example electrons 1040 and 1041 move toward the bit line. Electron 1040 is generated at the SGD transistor and electron 1041 is generated at a junction of the storage element 1015 in the channel region 1017. Also, in the drain side, example holes including a hole 1042 move away from the bit line as indicated by arrows. The hole 1042 is generated at a junction of the storage element 1015 in the channel region 1017 and can tunnel into the CTL region 1018 as indicated by arrow 1043.

In the source side, example electrons 1045 and 1049 move toward the source line. Electron 1045 is generated at the SGS transistor and electron 1049 is generated at a junction of the storage element 1065 in the channel region 1067. Also, in the source side, example holes including a hole 1047 move away from the source line as indicated by the arrow. The hole 1047 is generated at a junction of the storage element 1065 in the channel region 1067 and can tunnel into the CTL region 1068 as indicated by arrow 1048.

Figure 10B:
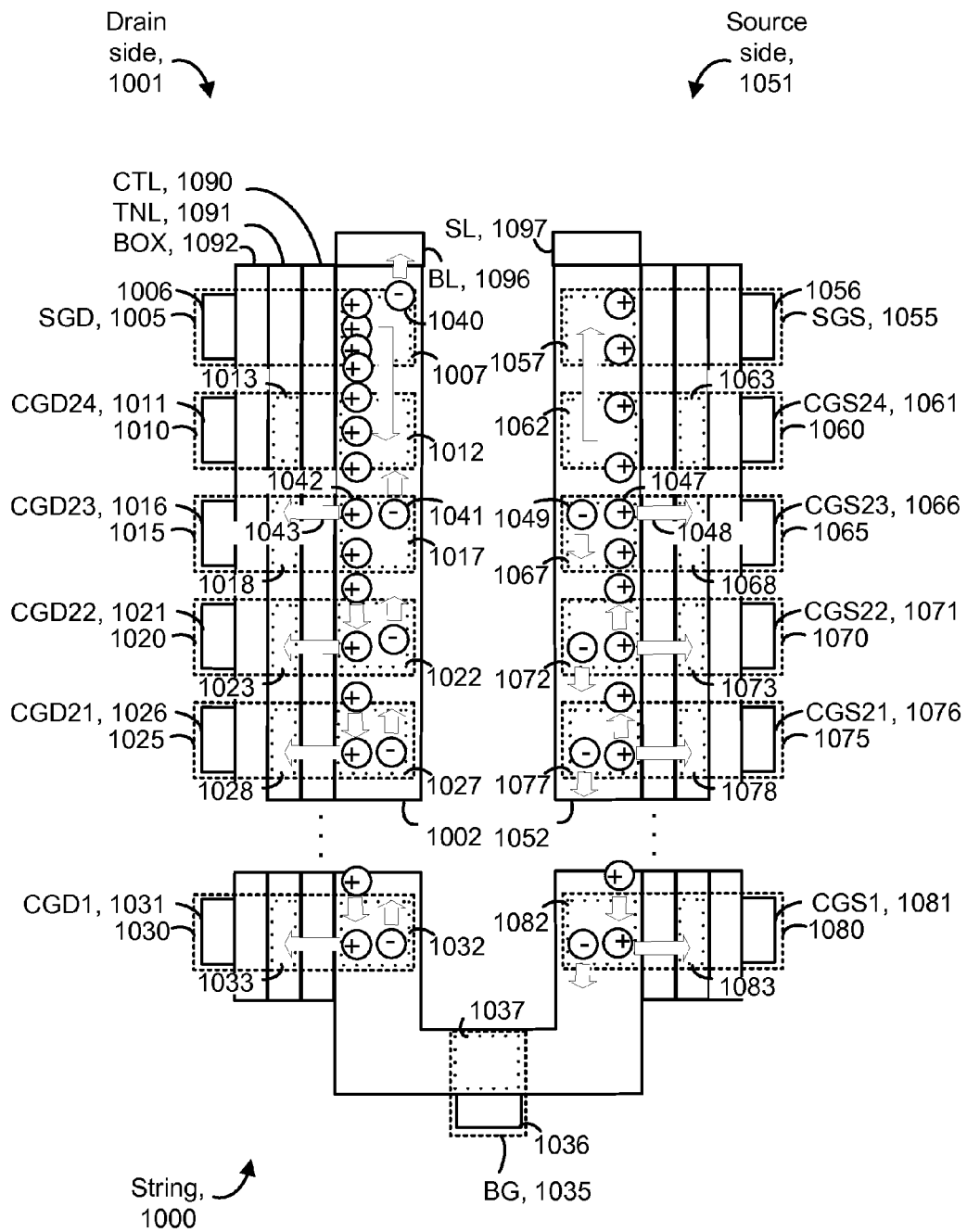
FIG. 10B depicts the movement of holes and electrons in a U-shaped NAND string during a one-sided erase.

FIG. 10B depicts the movement of holes and electrons in a U-shaped NAND string during a one-sided erase. The diagram of FIG. 10A is modified to show that the holes on the source side move in the opposite direction of FIG. 10A, away from the bit line end and toward the source line end. Similarly, the electrons on the source side move in the opposite direction of FIG. 10A, toward the bit line end and away from the source line end.

Accordingly, it can be seen that, in one embodiment, a method for performing an erase operation in a 3D stacked non-volatile memory device includes: charging a channel of the string by applying an erase voltage to one end of a string, the string comprises a plurality of storage elements and extends vertically through layers of the 3D stacked non-volatile memory device; during the charging of the channel, setting control gate voltages of the plurality of storage elements to encourage erasing of the storage elements; and performing an erase-verify test for the plurality of storage elements, at least one of the setting the control gate voltages or the performing the erase-verify test is based on an assignment of the plurality of storage elements to different groups, each group of the different groups comprises multiple adjacent storage elements of the plurality of storage elements.

In another embodiment, a 3D stacked non-volatile memory device includes: a string comprising a plurality of storage elements, the string comprises a channel and extends vertically through layers of the 3D stacked non-volatile memory device, and the plurality of storage elements are subdivided into different groups based on group assignments, each group of the different groups comprises multiple adjacent storage elements of the plurality of storage elements; and a control circuit in communication with the string. The control circuit, to perform an erase operation for the string: applies an erase voltage (e.g., 20 V) to one end of the string to charge the channel, during the charging of the channel, sets control gate voltages of the plurality of storage elements to encourage erasing of the storage elements, and performs an erase-verify test for the plurality of storage elements, at least one of the setting the control gate voltages or the performing the erase-verify test is based on the groups assignments.

In another embodiment, a method for performing an erase operation in a 3D stacked non-volatile memory device includes: applying an erase voltage (20 V) to one end of a string, the string comprises a plurality of storage elements and extends vertically through layers of the 3D stacked non-volatile memory device, and the plurality of storage elements are assigned to different groups, each group comprising multiple adjacent storage elements of the plurality of storage elements; during the applying of the erase voltage, setting control gate voltages of the plurality of storage elements to encourage erasing of the storage elements, the control gate voltages are different for each group of the different groups; and performing an erase-verify test for the plurality of storage elements.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for performing an erase operation in a 3D stacked non-volatile memory device, comprising:
   charging a channel of a string by applying an erase voltage to one end of a string, the string comprises a plurality of storage elements and extends vertically through layers of the 3D stacked non-volatile memory device;
   during the charging of the channel, setting control gate voltages of the plurality of storage elements to encourage erasing of the storage elements; and
   performing an erase-verify test for the plurality of storage elements, at least one of the setting the control gate voltages or the performing the erase-verify test is based on an assignment of the plurality of storage elements to different groups, each group of the different groups comprises multiple adjacent storage elements of the plurality of storage elements.

2. The method of claim 1, wherein:
   the control gate voltages are different for each group of the different groups and common within each group; and
   the erase-verify test is performed concurrently for the different groups.

3. The method of claim 2, wherein:
   the erase-verify test is performed concurrently for the different groups by applying a common erase-verify control gate voltage to the plurality of storage elements while detecting a current through the string.

4. The method of claim 2, wherein:
   for each group, the control gate voltage is a function of a distance of the group from the one end of the string.

5. The method of claim 4, wherein:
   the control gate voltage decreases with a distance of the group from the one end of the string.

6. The method of claim 1, wherein:
   the control gate voltages are common for each group of the different groups; and
   the erase-verify test is performed one group at a time for the different groups.

7. The method of claim 6, further comprising:
   providing an erase status=inhibit for one or more groups of the different groups which pass the erase-verify test;
   providing an erase status=erase for remaining groups of the different groups which do not pass the erase-verify test;
   the charging of the channel and the setting the control gate voltages occur in an erase portion of one erase-verify iteration; and
   in an erase portion of a subsequent erase-verify iteration, for the one or more groups which have the erase status=inhibit, floating the control gate voltages, or driving the control gate voltages at a level which discourages erasing of storage elements in the one or more groups and, for the remaining groups of the different groups which do not pass the erase-verify test, setting the control gate voltages at a level which encourages erasing of storage elements in the one or more groups.

8. The method of claim 6, wherein:
   for each group, the erase-verify test is performed by applying an erase-verify control gate voltage to storage elements in the group and applying a pass voltage to storage elements in remaining groups while detecting a current through the string, the erase-verify control gate voltage is common among the groups.

9. The method of claim 1, wherein:
   before applying the erase voltage, pre-charging the channel by applying a pre-charge voltage which is lower than the erase voltage to the one end of the string, the pre-charge voltage charges the channel by gate-induced drain leakage of a select gate at the one end of the string.

10. The method of claim 1, wherein:
    the control gate voltages encourage erasing of the storage elements by being sufficiently low compared to a voltage in the channel to induce tunneling of holes from the channel into charge trapping regions of the storage elements.

11. A 3D stacked non-volatile memory device, comprising:
    a string comprising a plurality of storage elements, the string comprises a channel and extends vertically through layers of the 3D stacked non-volatile memory device, and the plurality of storage elements are subdivided into different groups based on group assignments, each group of the different groups comprises multiple adjacent storage elements of the plurality of storage elements; and
    a control circuit in communication with the string, the control circuit, to perform an erase operation for the string: applies an erase voltage to one end of the string to charge the channel, during the charging of the channel, sets control gate voltages of the plurality of storage elements to encourage erasing of the storage elements, and performs an erase-verify test for the plurality of storage elements, at least one of the setting the control gate voltages or the performing the erase-verify test is based on the groups assignments.

12. The 3D stacked non-volatile memory device of claim 11, wherein:
    the control gate voltages are different for each group of the different groups and common within each group; and the erase-verify test is performed concurrently for the different groups.

13. The 3D stacked non-volatile memory device of claim 11, wherein:
the control gate voltages are common for each group of the different groups; and
the erase-verify test is performed one group at a time for the different groups.

14. The 3D stacked non-volatile memory device of claim 11, wherein:
the channel is in a vertical memory hole.

15. The 3D stacked non-volatile memory device of claim 11, wherein:
the string is U-shaped; and
the groups extend from one end of the string to a back gate of the string.

16. The 3D stacked non-volatile memory device of claim 11, wherein:
the string is straight; and
the groups extend from one end of the string to an opposing end of the string.

17. A method for performing an erase operation in a 3D stacked non-volatile memory device, comprising:
applying an erase voltage to one end of a string, the string comprises a plurality of storage elements and extends vertically through layers of the 3D stacked non-volatile memory device, and the plurality of storage elements are assigned to different groups, each group comprising multiple adjacent storage elements of the plurality of storage elements;
during the applying of the erase voltage, setting control gate voltages of the plurality of storage elements to encourage erasing of the storage elements, the control gate voltages are different for each group of the different groups; and
performing an erase-verify test for the plurality of storage elements.

18. The method of claim 17, wherein:
the erase-verify test is performed concurrently for the different groups.

19. The method of claim 17, wherein:
the erase-verify test is performed one group at a time for the different groups.

20. The method of claim 17, wherein:
the control gate voltages are common within each group.

* * * * *